(12) United States Patent
Lee

(10) Patent No.: US 12,144,174 B2
(45) Date of Patent: Nov. 12, 2024

(54) SEMICONDUCTOR DEVICE INCLUDING BONDING STRUCTURES AND CHIP GUARDS

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 250 days.

(21) Appl. No.: 17/165,593

(22) Filed: Feb. 2, 2021

(65) Prior Publication Data

US 2022/0045093 A1 Feb. 10, 2022

(30) Foreign Application Priority Data

Aug. 7, 2020 (KR) .................. 10-2020-0099316

(51) Int. Cl.
*H10B 43/27* (2023.01)
*H01L 23/00* (2006.01)
(Continued)

(52) U.S. Cl.
CPC ............. *H10B 43/27* (2023.02); *H01L 24/06* (2013.01); *H10B 41/10* (2023.02); *H10B 41/27* (2023.02);
(Continued)

(58) Field of Classification Search
CPC ............... H01L 27/11582; H01L 24/06; H01L 27/11556; H01L 24/08; H01L 2224/08058;
(Continued)

(56) References Cited

U.S. PATENT DOCUMENTS 10,354,980 B1 7/2019 Mushiga et al.
10,665,607 B1 * 5/2020 Sugiura .................. H10B 43/50
(Continued)

FOREIGN PATENT DOCUMENTS

KR 1020160075077 A 6/2016
KR 1020160123081 A 10/2016
(Continued)

OTHER PUBLICATIONS

IP.com npl search (Year: 2024).*

*Primary Examiner* — William B Partridge
*Assistant Examiner* — David Paul Sedorook
(74) *Attorney, Agent, or Firm* — WILLIAM PARK & ASSOCIATES LTD.

(57) ABSTRACT

A semiconductor device includes: a substrate; a first connection structure disposed on the substrate, the first connection structure Including a first connection conductor; a transistor disposed between the substrate and the first connection structure; a first bonding structure Including a first bonding pad connected to the first connection conductor; a second bonding structure including a second bonding pad connected to the first bonding pad; a second connection structure including a second connection conductor connected to the second bonding pad; a stack structure disposed on the second connection structure; a channel structure penetrating the stack structure; and a chip guard penetrating the second connection structure, the second bonding structure, the first bonding structure, and the first connection structure, the chip guard surrounding the stack structure and the channel structure.

20 Claims, 17 Drawing Sheets

(51) Int. Cl.
　　　*H10B 41/10*　　(2023.01)
　　　*H10B 41/27*　　(2023.01)
　　　*H10B 41/41*　　(2023.01)
　　　*H10B 43/10*　　(2023.01)
　　　*H10B 43/35*　　(2023.01)
(52) U.S. Cl.
　　　CPC ............ *H10B 41/41* (2023.02); *H10B 43/10* (2023.02); *H10B 43/35* (2023.02)
(58) Field of Classification Search
　　　CPC ..... H01L 2224/08145; H01L 27/11568; H10B 41/10; H10B 41/27; H10B 41/41
　　　See application file for complete search history.

(56) References Cited

U.S. PATENT DOCUMENTS

| | | | |
|---|---|---|---|
| 10,714,497 B1* | 7/2020 | Nishida | H01L 21/76802 |
| 2011/0057297 A1* | 3/2011 | Lee | H01L 21/78 |
| | | | 257/E23.179 |
| 2017/0103929 A1* | 4/2017 | Lee et al. | H01L 21/66 |
| 2018/0096955 A1* | 4/2018 | Zhu | H01L 23/53271 |
| 2020/0066745 A1* | 2/2020 | Yu | H10B 43/27 |
| 2020/0091184 A1* | 3/2020 | Asai | H01L 27/11582 |
| 2020/0258817 A1* | 8/2020 | Okina | H10B 43/40 |
| 2021/0313246 A1* | 10/2021 | Matsumura | H10B 43/40 |
| 2022/0028846 A1* | 1/2022 | Alsmeier | H01L 25/50 |

FOREIGN PATENT DOCUMENTS

| | | |
|---|---|---|
| KR | 1020170042206 A | 4/2017 |
| KR | 1020200078752 A | 7/2020 |

* cited by examiner

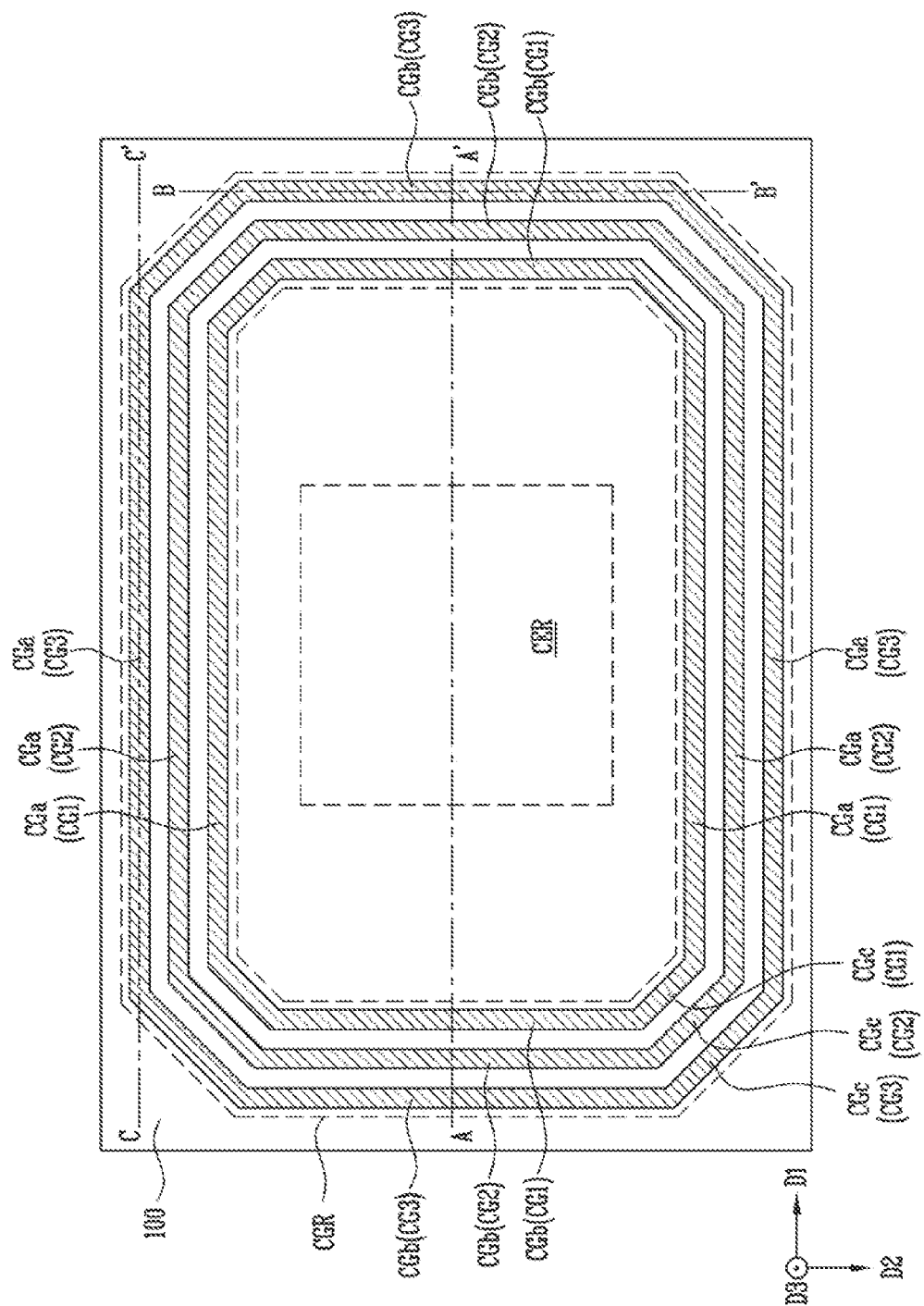

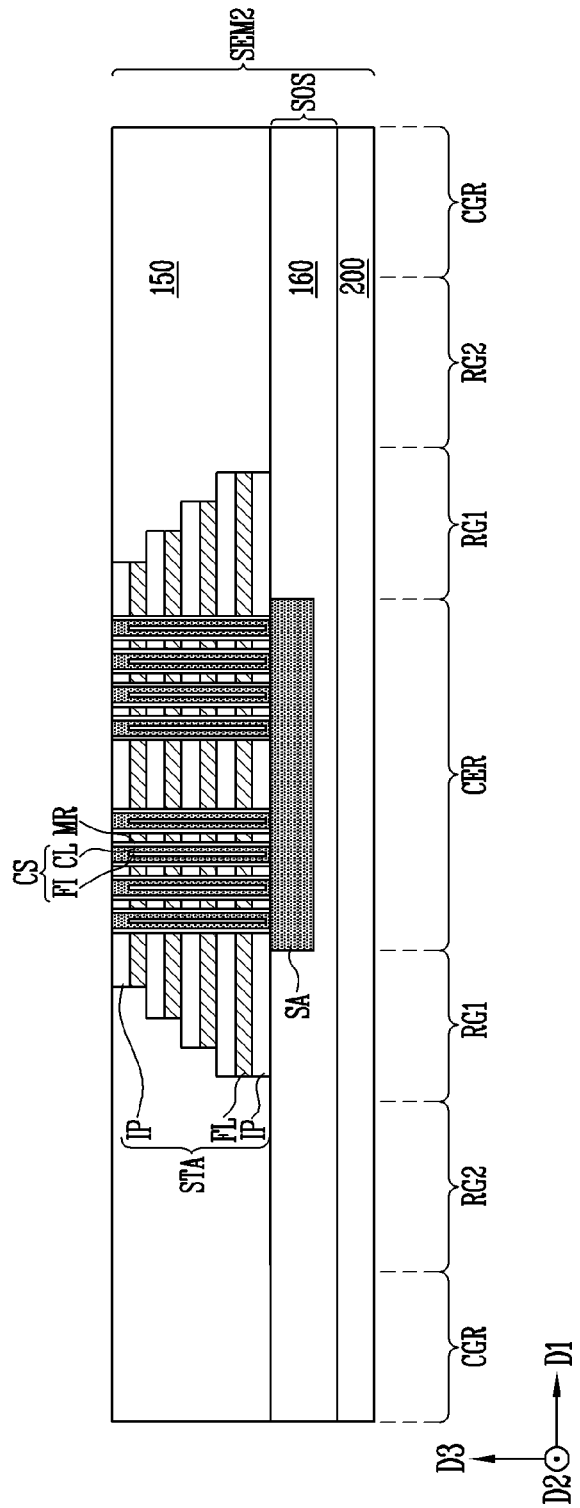

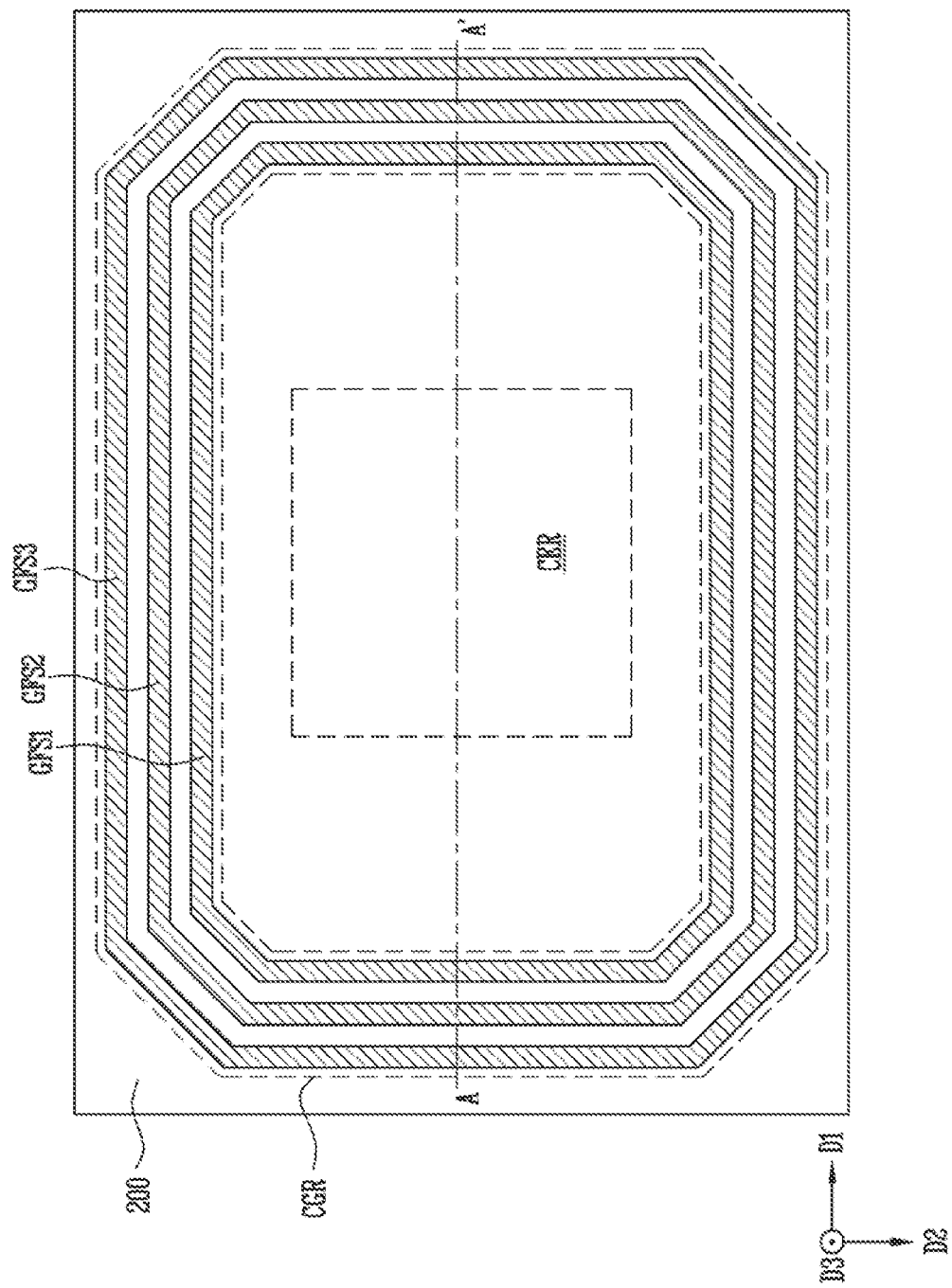

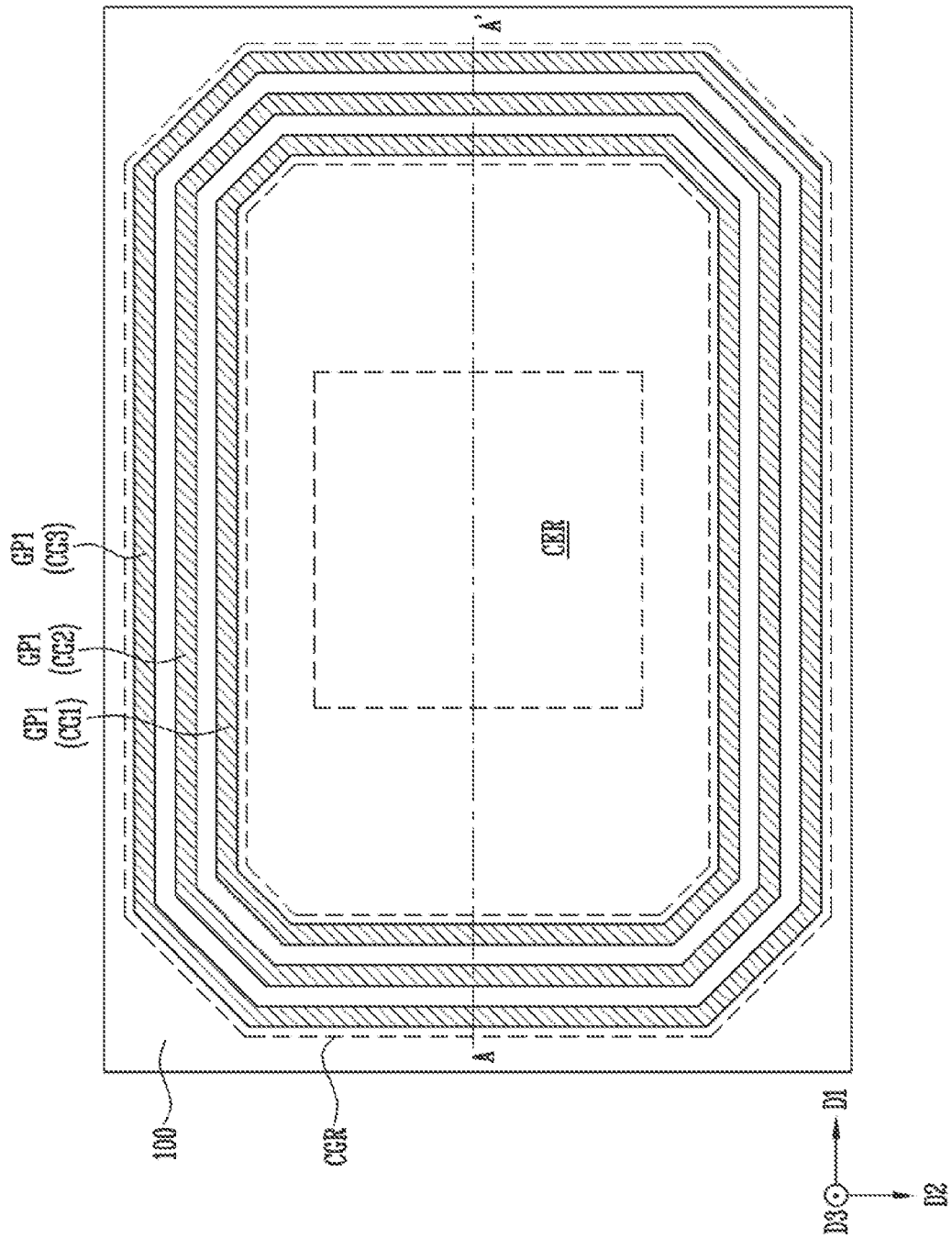

SEMICONDUCTOR DEVICE INCLUDING BONDING STRUCTURES AND CHIP GUARDS

CROSS-REFERENCE TO RELATED APPLICATION

The present application claims priority under 35 U.S.C. § 119(a) to Korean patent application number 10-2020-0099316, filed on Aug. 7, 2020, in the Korean Intellectual Property Office, the entire disclosure of which is incorporated herein by reference.

BACKGROUND

1. Technical Field

The present disclosure generally relates to a semiconductor device and a manufacturing method of a semiconductor device, and more particularly, to a three-dimensional semiconductor device and a manufacturing method of a three-dimensional semiconductor device.

2. Related Art

A semiconductor device includes memory cells capable of storing data. A three-dimensional semiconductor device includes three-dimensionally arranged memory cells, so that an area occupied by memory cells per unit area of a substrate can be reduced.

In order to improve the degree of integration of the three-dimensional semiconductor device, a stacked number of memory cells may be increased. However, the operational reliability of the three-dimensional semiconductor device may deteriorate as the stacked number of memory cells is increased.

SUMMARY

In accordance with the present disclosure, a semiconductor device includes: a substrate; a first connection structure disposed on the substrate, the first connection structure including a first connection conductor; a transistor disposed between the substrate and the first connection structure, the transistor being connected to the first connection conductor; a first bonding structure including a first bonding pad connected to the first connection conductor, the first bonding structure being disposed on the first connection structure; a second bonding structure including a second bonding pad connected to the first bonding pad, the second bonding structure being disposed on the first bonding structure; a second connection structure including a second connection conductor connected to the second bonding pad, the second connection structure being disposed on the second bonding structure; a stack structure disposed on the second connection structure, the stack structure including alternately stacked insulating layers and conductive patterns; a channel structure penetrating the stack structure, the channel structure being connected to the second connection conductor; and a chip guard penetrating the second connection structure, the second bonding structure, the first bonding structure, and the first connection structure, the chip guard surrounding the stack structure and the channel structure.

Also in accordance with the present disclosure, a semiconductor device includes: a transistor; a first connection conductor connected to the transistor; a first bonding pad connected to the first connection conductor; a second bonding pad connected to the first bonding pad; a second connection conductor connected to the second bonding pad; a channel structure connected to the second connection conductor; and a chip guard including a first guard part and a second guard part on the first guard part, wherein the second guard part surrounds the first bonding pad, the second bonding pad, the second connection conductor, and the channel structure.

Further in accordance with the present disclosure, a semiconductor device includes: a transistor; a first connection conductor connected to the transistor; a first bonding pad connected to the first connection conductor; a second bonding pad connected to the first bonding pad; a second connection conductor connected to the second bonding pad; a channel structure connected to the second connection conductor; a stack structure surrounding the channel structure; and a chip guard surrounding the first connection conductor, the first bonding pad, the second bonding pad, the second connection conductor, the channel structure, and the stack structure, wherein the chip guard includes a first guard part and a second guard part on the first guard part, and wherein the first bonding pad, the second bonding pad, the second connection conductor, the channel structure, and the stack structure are disposed at a level higher than a level of a bottom surface of the second guard part and lower than a level of a top surface of the second guard part.

Additionally in accordance with the present disclosure, a method of manufacturing a semiconductor device includes: forming a first semiconductor structure including a first transistor, a second transistor, and a first bonding pad electrically connected to the first transistor; forming a second semiconductor structure including a stack structure, a channel structure penetrating the stack structure, a second bonding pad electrically connected to the channel structure, and a contact sacrificial structure; bonding the first semiconductor structure to the second semiconductor structure by bonding the first bonding pad to the second bonding pad; forming a first hole in the second semiconductor structure by removing the contact sacrificial structure; forming a second hole extending to inside of the first semiconductor structure from the second semiconductor structure by expanding the first hole; and forming a contact in the second hole.

Likewise in accordance with the present disclosure, a method of manufacturing a semiconductor device includes: forming a first semiconductor structure including a first transistor and a first bonding pad electrically connected to the first transistor; forming a second semiconductor structure including a stack structure, a channel structure penetrating the stack structure, and a second bonding pad electrically connected to the channel structure; bonding the first semiconductor structure to the second semiconductor structure by bonding the first bonding pad to the second bonding pad; forming a first through slit extending to inside of the first semiconductor structure from the second semiconductor structure; and forming a first guard part in the first through slit, wherein the first guard part surrounds the stack structure and the channel structure.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 1A is a plan view of a semiconductor device in accordance with an embodiment of the present disclosure.

FIGS. 2, 3A, 33, 4A, 4B, 5, 6, 7A, and 73 are views illustrating a manufacturing method of the semiconductor device shown in FIGS. 1A to 1F.

DETAILED DESCRIPTION

The specific structural and functional descriptions disclosed herein are merely illustrative for the purpose of describing embodiments according to the concept of the present disclosure. Embodiments according to the concept of the present disclosure can be implemented in various forms and should not be construed as being limited to the embodiments set forth herein.

Embodiments are directed to a semiconductor device and a manufacturing method of a semiconductor device having improved operational reliability.

Figure 1B:
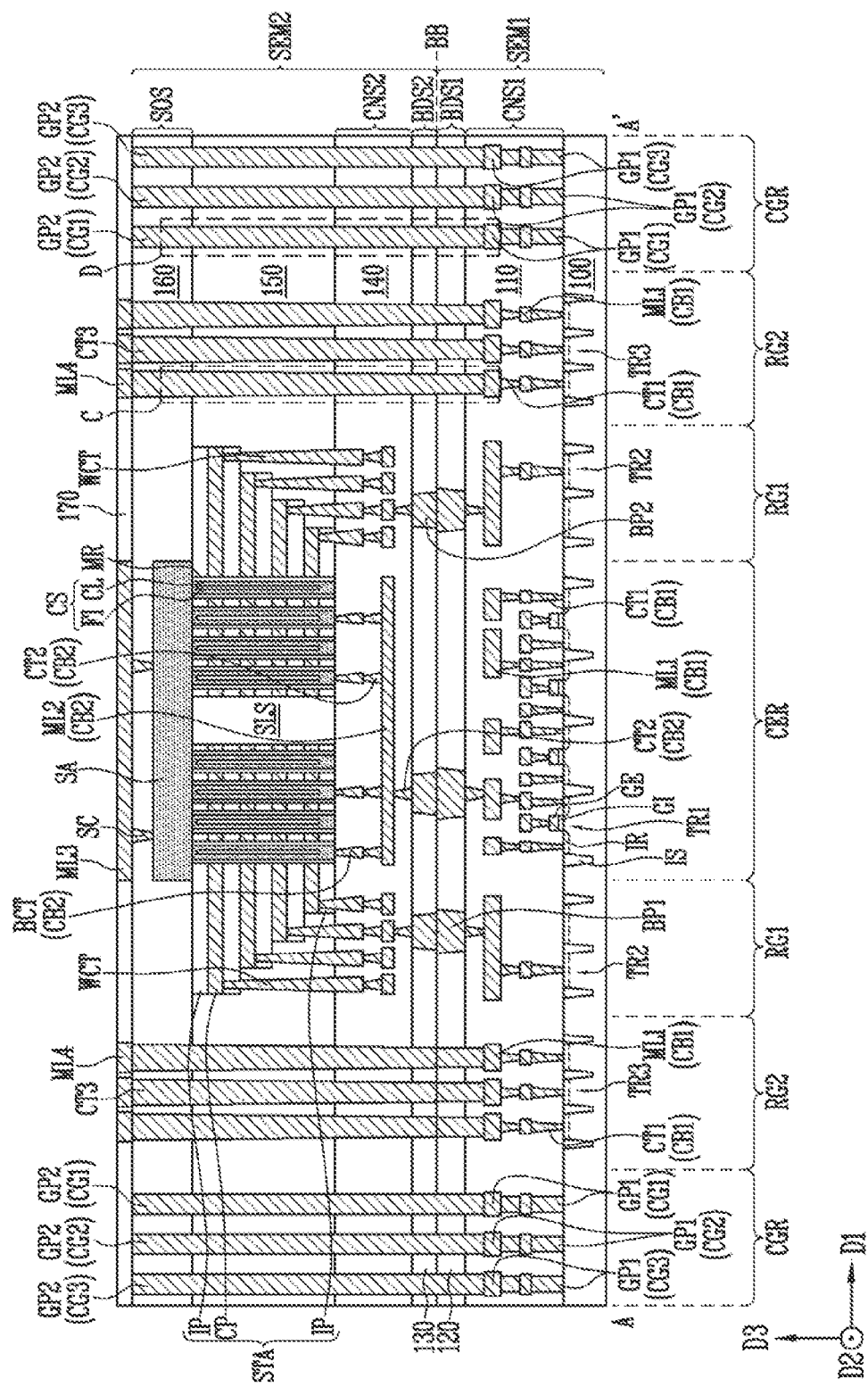
FIG. 1B is a sectional view taken along line A-A' shown in FIG. 1A.
Figure 1C:
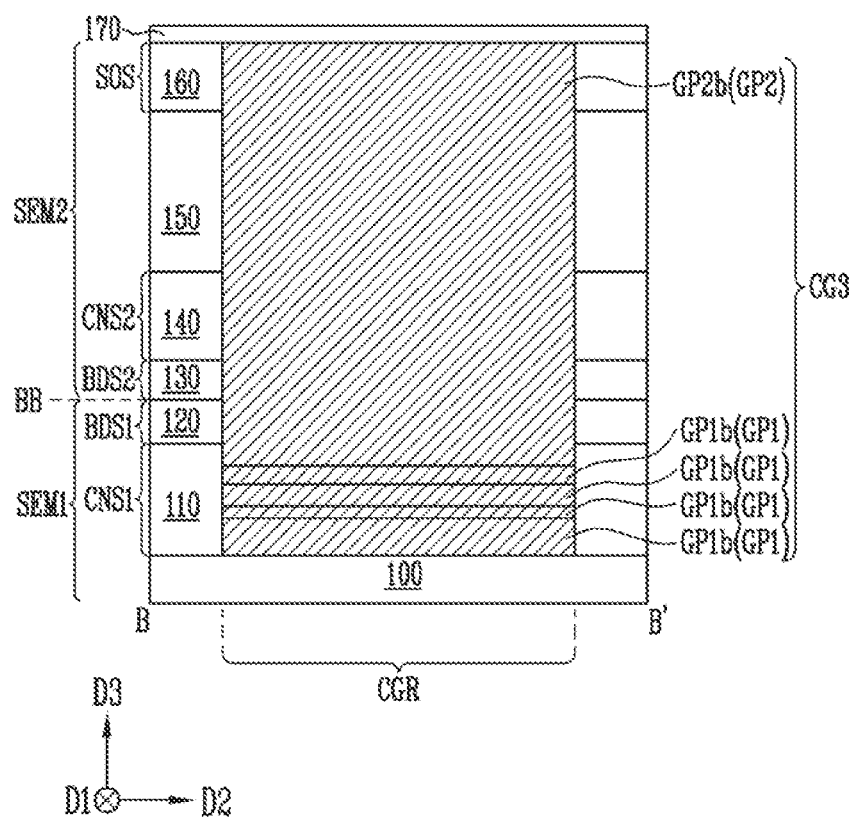
FIG. 1C is a sectional view taken along line B-B' shown in FIG. 1A.
Figure 1D:
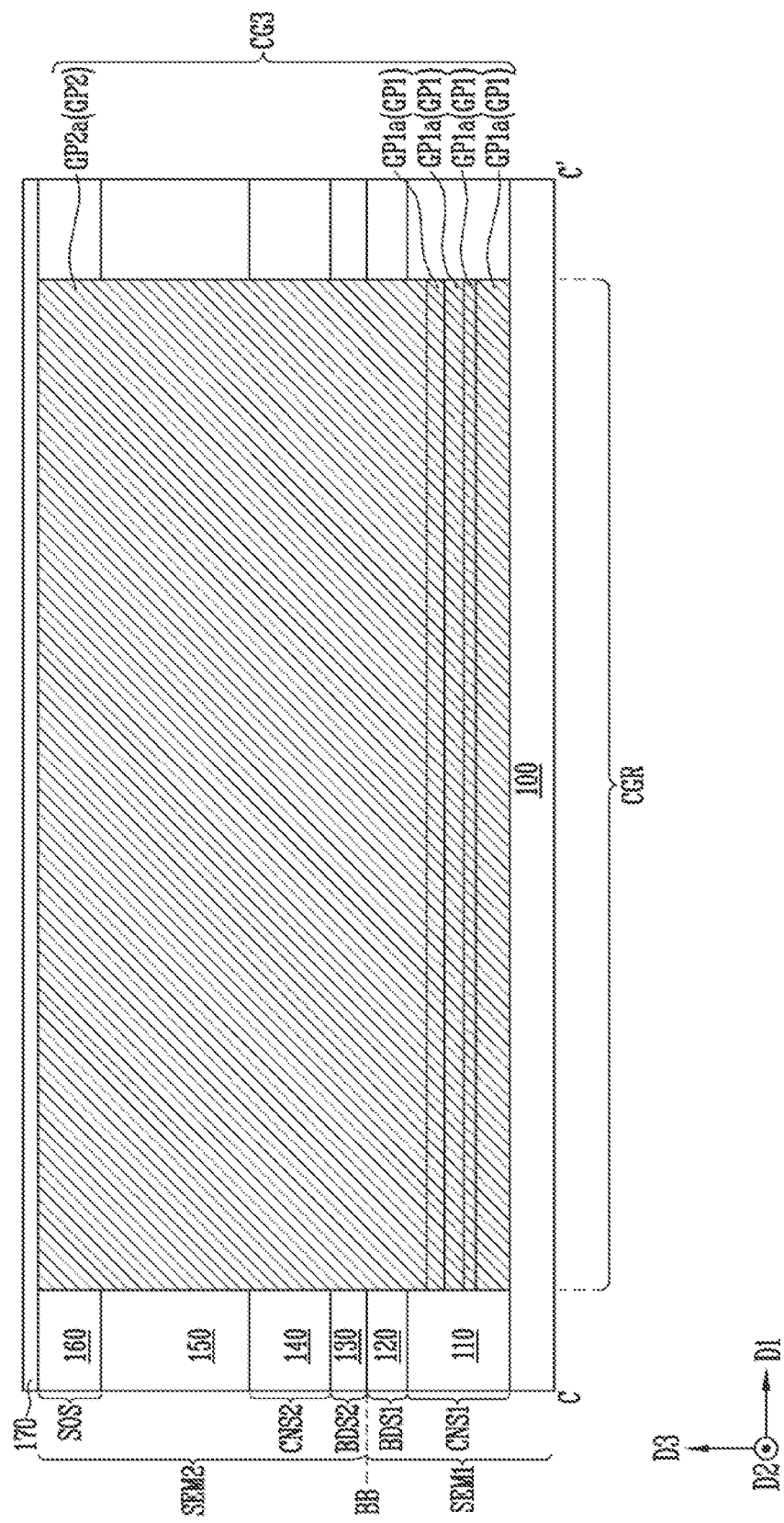
FIG. 1D is a sectional view taken along line C-C' shown in FIG. 1A.
Figure 1E:
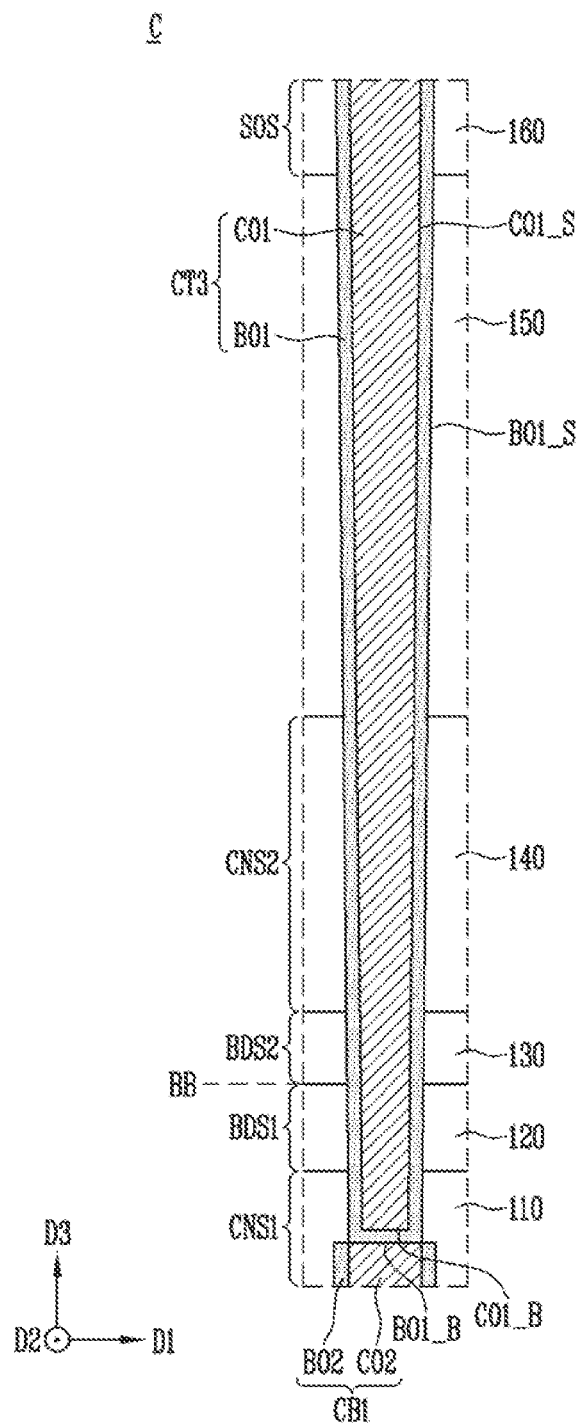
FIG. 1E is an enlarged view of region C shown in FIG. 1B.
Figure 1F:
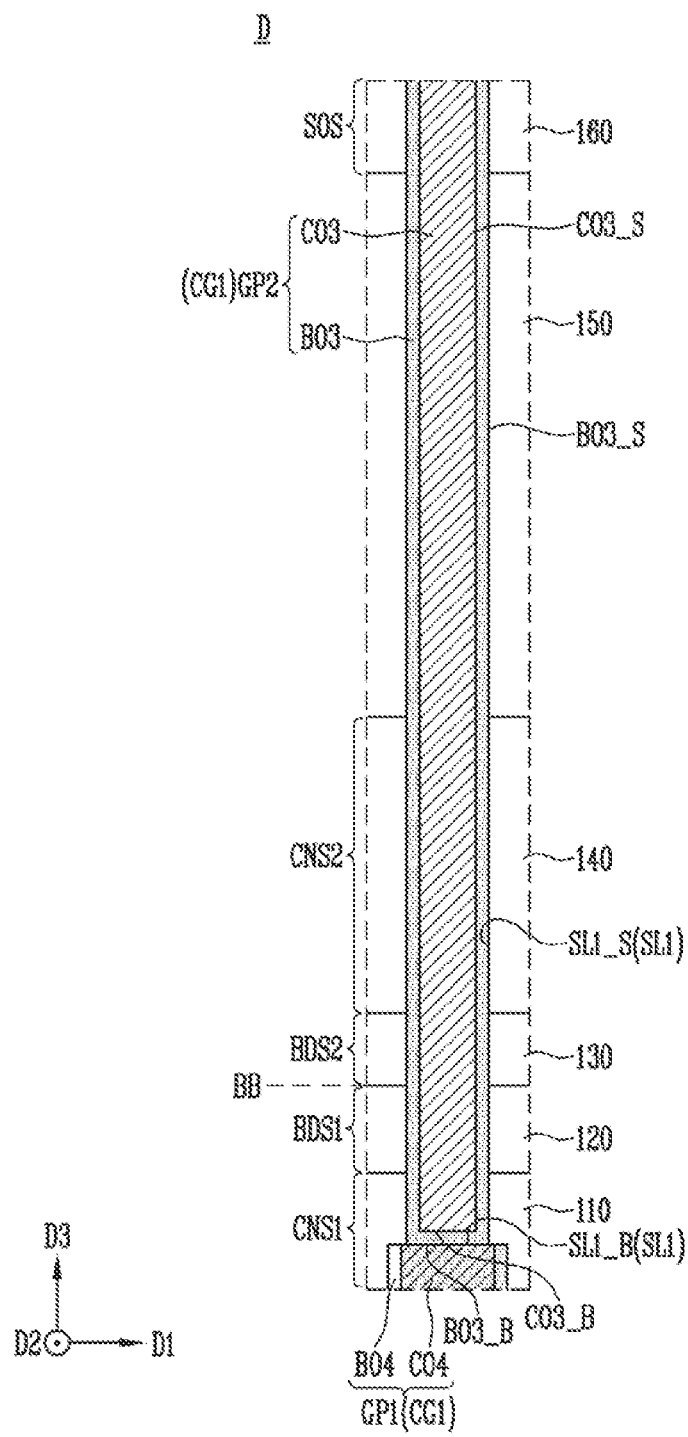
FIG. 1F is an enlarged view of region D shown in FIG. 1B.

FIG. 1A is a plan view of a semiconductor device in accordance with an embodiment of the present disclosure. FIG. 13 is a sectional view taken along line A-A' shown in FIG. 1A. FIG. 1C is a sectional view taken along line B-B' shown in FIG. 1A. FIG. 1D is a sectional view taken along line C-C' shown in FIG. 1A. FIG. 1E is an enlarged view of region C shown in FIG. 1B. FIG. 1F is an enlarged view of region D shown in FIG. 1B.

Referring to FIGS. 1A to 1D, the semiconductor device may include a cell region CER, a first region RG1, a second region RG2, and a chip guard region CGR. The cell region CER, the first region RG1, the second region RG2, and the chip guard region CGR may be regions distinguished from each other from a planar viewpoint defined by a first direction D1 and a second direction D2. The chip guard region CGR may surround the cell region CER. The first region RG1 and the second region RG2 may be disposed between the cell region CER and the chip guard region CGR.

The semiconductor device may include a first semiconductor structure SEM1 and a second semiconductor structure SEM2. The first semiconductor structure SEM1 and the second semiconductor structure SEM2 may be bonded to each other through a wafer bonding process. The first semiconductor structure SEM1 may include a first substrate 100, a first connection structure CNS1, and a first bonding structure BDS1. The second semiconductor structure SEM2 may include a second bonding structure BDS2, a second connection structure CNS2, a stack structure STA, channel structures CS, and a source structure SOS.

The first substrate 100 may have the shape of a plate expanding along a plane defined by the first direction D1 and the second direction D2. The first direction D1 and the second direction D2 may intersect each other in that they are not parallel to each other. For example, the first direction D1 and the second direction D2 may be orthogonal to each other. The first substrate 100 may be a semiconductor substrate. In an example, the first substrate 100 may be a silicon substrate.

The first connection structure CNS1 may be provided on the first substrate 100. The first connection structure CNS1 may include a first insulating layer 110 and first connection conductors CB1. The first insulating layer 110 may cover the first substrate 100. The first insulating layer 110 may include an insulating material. In an example, the first insulating layer 110 may include an oxide or nitride.

The first connection conductors CB1 may include first contacts CT1 and first lines ML1. The first contacts CT1 and the first lines ML1 may be connected to each other. The first contacts CT1 and the first lines ML1 may include a conductive material.

First transistors TR1, second transistors TR2, and third transistors TR3 may be provided between the first connection structure CNS1 and the first substrate 100. The first transistors TR1 may be transistors provided in the cell region CER. The second transistors TR2 may be transistors provided in the first region RG1. The third transistors TR3 may be transistors provided in the second region RG2.

The first transistors TR1 may be transistors which constitute a page buffer of the semiconductor device or are connected to the page buffer. The second transistors TR2 may be transistors which constitute an X-decoder of the semiconductor device or are connected to the X-decoder. The third transistors TR3 may be transistors which constitute an electrostatic discharge (ESD) circuit of the semiconductor device or are connected to the ESD circuit.

Each of the first to third transistors TR1, TR2, and TR3 may include impurity regions IR, a gate insulating layer GI, and a gate electrode GE. The impurity regions IR may be formed by doping an impurity into the first substrate 100. The impurity region IR may be connected to the first connection conductor CB1. The impurity regions IR may be connected to the first contact CT1. The gate insulating layer GI may include an insulating material. In an example, the gate insulating layer GI may include an oxide. The gate electrode GE may include a conductive material. The gate electrode GE may be connected to the first connection conductor CB1. The gate electrode GE may be connected to the first contact CT1.

Isolation layers IS may be provided in the first substrate 100. The isolation layers IS may electrically isolate the first to third transistors TR1, TR2, and TR3 from each other. The isolation layers IS may include an insulating material. In an example, the isolation layers IS may include an oxide.

The first bonding structure BDS1 may be provided on the first connection structure CNS1. The first bonding structure BDS1 may include a second insulating layer 120 and first bonding pads BP1. The second insulating layer 120 may cover the first insulating layer 110. The second insulating layer 120 may include an insulating material. In an example, the second insulating layer 120 may include a nitride or oxide.

The first bonding pad BP1 may be connected to the first connection conductor CB1 in the first connection structure CNS1. The first bonding pad BP1 may be connected to the first contact CT1 in the first connection structure CNS1. The first bonding pads BP1 may include a conductive material. In an example, the first bonding pads BP1 may include copper.

The second bonding structure BDS2 may be provided on the first bonding structure BDS1. The second bonding structure BDS2 may include a third insulating layer 130 and second bonding pads BP2. The third insulating layer 130 may cover the second insulating layer 120. The third insulating layer 130 and the second insulating layer 120 may be bonded to each other through a wafer bonding process. The third insulating layer 130 may include an insulating material. In an example, the third insulating layer 130 may include a nitride or oxide. An interface between the first bonding structure BDS1 and the second bonding structure BDS2 may be defined as a bonding interface.

The second bonding pad BP2 may be connected to the first bonding pad BP1 in the first bonding structure BDS1. The second bonding pad BP2 and the first bonding pad BP1 may be bonded to each other through a wafer bonding process. The second bonding pads BP2 may include a conductive material. In an example, the second bonding pads BP2 may include copper.

The second connection structure CNS2 may be provided on the second bonding structure BDS2. The second connection structure CNS2 may include a fourth insulating layer 140 and second connection conductors CB2. The fourth insulating layer 140 may cover the third insulating layer 130. The fourth insulating layer 140 may include an insulating material. In an example, the fourth insulating layer 140 may include an oxide or nitride.

The second connection conductors CB2 may include second lines ML2, second contacts CT2, and bit line contacts BCT. The second contact CT2 may be connected to the second line ML2. The bit line contact BCT may be connected to the second contact CT2. The second bonding pad BP2 may be connected to the second connection conductor CB2 in the second connection structure CNS2. The second lines ML2, the second contact CT2, and the bit line contacts BCT may include a conductive material.

The stack structure STA may be provided on the second connection structure CNS2. The stack structure STA may include conductive patterns CP and insulating layers IP which are alternately stacked. The conductive patterns CP may be used as word lines or select lines of the semiconductor device. The conductive patterns CP may include a conductive material. The insulating layers IP may include an insulating material. In an example, the insulating layers IP may include an oxide. The stack structure STA may include a stepped structure defined by the conductive patterns CP and the insulating layers IP.

The channel structures CS and memory layers MR may be provided, which penetrate the stack structure STA. The stack structure STA may surround the channel structures CS and the memory layers MR. The channel structure CS may extend in a third direction D3. The channel structure CS may include a filling layer FI and a channel layer CL surrounding the filling layer FI. The filling layer FI may include an insulating material. In an example, the filling layer FI may include an oxide. The channel structure CS may be connected to the second connection conductor CB2. The channel layer CL may be connected to the second line ML2 through the bit line contact BCT and the second contact CT2. The semiconductor device may include the bit line contacts BCT, the second contacts CT2, and the second line ML2, which are shown in FIG. 1B, and include bit line contacts, second contacts, and a second line, which are not shown in FIG. 1B. Channel layers CL which are not connected to the bit line contacts BCT, the second contacts CT2, and the second line ML2, which are shown in FIG. 1B, may be connected to the bit line contacts, the second contacts, and the second line, which are not shown in FIG. 1B.

The channel layer CL may be electrically connected the first transistor TR1 through the bit line contact BCT, the second contact CT2 in the cell region CER, the second line ML2 in the cell region CER, the second bonding pad BP2 in the cell region CER, the first bonding pad BP1 in the cell region CER, the first contact CT1 in the cell region CER, and the first line ML1 in the cell region CER. The channel layer CL may include a conductive material. In an example, the channel layer CL may include poly-silicon.

The memory layer MR may extend in the third direction D3. The memory layer MR may include a tunnel insulating layer surrounding the channel structure CS, a data storage layer surrounding the tunnel insulating layer, and a blocking layer surrounding the data storage layer. The tunnel insulating layer may include a material through which charges can tunnel. In an example, the tunnel insulating layer may include an oxide. In an embodiment, the data storage layer may include a material in which charges can be trapped. In an example, the data storage layer may include a nitride. In another embodiment, the data storage layer may include various materials according to a data storage method. In an example, the data storage layer may include silicon, a phase change material, or nano dots. The blocking layer may include a material capable of blocking movement of charges. In an example, the blocking layer may include an oxide.

A slit structure SLS may be provided, which penetrates the stack structure STA. The slit structure SLS may extend in the second direction D2 and the third direction D3. Conductive patterns CP disposed at the same layer may be isolated from each other in the first direction D1 by the slit structure SLS. Insulating layers IP disposed at the same level may be isolated from each other in the first direction D1 by the slit structure SLS. The slit structure SLS may include an insulating material. In an example, the slit structure SLS may include an oxide.

The second semiconductor structure SEM2 may include a fifth insulating layer 150. The fifth insulating layer 150 may be provided on the second connection structure CNS2. The fifth insulating layer 150 may cover the stepped structure of the stack structure STA. The fifth insulating layer 150 may surround the stack structure STA. The fifth insulating layer 150 may include an insulating material. In an example, the fifth insulating layer 150 may include an oxide.

The second semiconductor structure SEM2 may further include word line contacts WCT. The word line contacts WCT may connect the second connection conductors CB2 of the second connection structure CNS2 and the conductive patterns CP of the stack structure STA. The word line contacts WCT may connect the second contacts CT2 of the second connection structure CNS2 and the conductive patterns CP of the stack structure STA. The conductive pattern CP of the stack structure STA may be electrically connected to the second transistor TR2 through the word line contact WCT, the second contact CT2 in the first region RG1, the second line ML2 in the first region RG1, the second bonding pad BP2 in the first region RG1, the first bonding pad BP1 in the first region RG1, the first contact CT1 in the first region RG1, and the first line ML1 in the first region RG1.

The source structure SOS may be provided on the stack structure STA and the fifth insulating layer 150. The source structure SOS may include a source layer SA, a sixth insulating layer 160, and source contacts SC. The source layer SA may be provided on the stack structure STA. The source layer SA may have the shape of a plate extending along a plane defined by the first direction D1 and the second direction D2. The source layer SA may be connected to the channel layers CL. The source layer SA may include a conductive material. In an example, the source layer SA may include poly-silicon.

The sixth insulating layer 160 may cover the source layer SA. The sixth insulating layer 160 may include an insulating material. In an example, the sixth insulating layer 160 may include an oxide or nitride.

The source contacts SC may be provided in the sixth insulating layer 160. The source contacts SC may be connected to the source layer SA. The source contacts SC may include a conductive material.

Third contacts CT3 may be provided, which penetrates the sixth insulating layer 160 of the source structure SOS, the fifth insulating layer 150, the fourth insulating layer 140 of the second connection structure CNS2, the third insulating layer 130 of the second bonding structure BDS2, and the second insulating layer 120 of the first bonding structure BDS1. The third contacts CT3 may be provided in the second region RG2. The third contact CT3 may be in contact with the first line ML1 in the second region RG2. The third contact CT3 may be electrically connected to the third transistor T3 through the first line ML1 in the second region RG2 and the first contact CT1 in the second region RG2.

Chip guards CG1, CG2, and CG3 may be provided, which penetrate the sixth insulating layer 160 of the source structure SOS, the fifth insulating layer 150, the fourth insulating layer 140 of the second connection structure CNS2, the third insulating layer 130 of the second bonding structure BDS2, the second insulating layer 120 of the first bonding structure BDS1, and the first insulating layer 110 of the first connection structure CNS1. Although a case where the semiconductor device includes three chip guards CG1, CG2, and CG3 has been illustrated, the number of chip guards is not limited to just three. For example, there may be four or more chip guards, or two or less chip guards. Hereinafter, a case where the number of chip guards CG1, CG2, and CG3 is three will be described as an example.

The semiconductor device may include a first chip guard CG1, a second chip guard CG2, and a third chip guard CG3. The first to third chip guards CG1, CG2, and CG3 may be provided in the chip guard region CGR. Each of the first to third chip guards CG1, CG2, and CG3 may surround the cell region CER. In an example, each of the first to third chip guards CG1, CG2, and CG3 may surround the cell region CER from a planar viewpoint (see FIG. 1A) defined by the first direction D1 and the second direction D2. Each of the first to third chip guards CG1, CG2, and CG3 may surround the first connection conductors CB1, the first and second bonding pads BP1 and BP2, the second connection conductors CB2, the word line contacts WCT, the stack structure STA, the channel structures CS, the memory layers MR, and the source layer SA. Each of the first to third chip guards CG1, CG2, and CG3 may surround the third contacts CT3. The second chip guard CG2 may surround the first chip guard CG1. The third chip guard CG3 may surround the first and second chip guards CG1 and CG2.

Each of the first to third chip guards CG1, CG2, and CG3 may include first parts CGa extending in the first direction D1, second parts CGb extending in the second direction D2, and third parts CGc connecting the first and second parts CGa and CGb (see FIG. 1A). The third parts CGc may extend in a direction intersecting the first direction D1 and the second direction D2, Each of the first to third chip guards CG1, CG2, and CG3 may have the shape of a ring from the planar viewpoint defined by the first direction D1 and the second direction D2.

The first parts CGa of each of the first to third chip guards CG1, CG2, and CG3 may be spaced apart from each other in the second direction D2. The cell region CER may be disposed between the first parts CGa of each of the first to third chip guards CG1, CG2, and CG3. The first and second connection conductors CB1 and CB2, the first and second bonding pads BP1 and BP2, the word line contacts WCT, the stack structure STA, the channel structures CS, the memory layers MR, and the source layer SA may be disposed between the first parts CGa of each of the first to third chip guards CG1, CG2, and CG3. A length of the first part CGa of each of the first to third chip guards CG1, CG2, and CG3 in the first direction D1 may be greater than that of the stack structure STA in the first direction D1.

The second parts CGb of each of the first to third chip guards CG1, CG2, and CG3 may be spaced apart from each other in the first direction D1. The cell region CER may be disposed between the second parts CGb of each of the first to third chip guards CG1, CG2, and CG3. The first and second connection conductors CB1 and CB2, the first and second bonding pads BP1 and BP2, the word line contacts WCT, the stack structure STA, the channel structures Cs, the memory layers MR, and the source layer SA may be disposed between the second parts CGb of each of the first to third chip guards CG1, CG2, and CG3. A length of the second part CGb of each of the first to third chip guards CG1, CG2, and CG3 may be greater than that of the stack structure STA in the second direction D2.

The cell region CER may be surrounded by the first to third parts CGa, CGb, and CGc of each of the first to third chip guards CG1, CG2, and CG3. The first and second connection conductors CB1, CB2, the first and second bonding pads BP1 and BP2, the word line contacts WCT, the stack structure STA, the channel structures CS, the memory layers MR, and the source layer SA may be surrounded by the first to third parts CGa, CGb, and CGc of each of the first to third chip guards CG1, CG2, and CG3.

Each of the first to third chip guards CG1, CG2, and CG3 may include a plurality of first guard parts GP1 and a second guard part GP2, which are stacked in the third direction D3. A planar shape of each of the first and second guard parts GP1, and GP2, which is defined by the first direction D1 and the second direction D2, may be similar to that of each of the first to third chip guards CG1, CG2, and CG3 shown in FIG. 1A, which is defined by the first direction D1 and the second direction D2. Each of the first and second guard parts GP1 and GP2 may have the shape of a ring from the planar viewpoint defined by the first direction D1 and the second direction D2.

Each of the first guard parts GP1 may include first parts GP1a (see FIG. 1D) extending in the first direction D1, second parts GP1b (see FIG. 1C) extending in the second direction D2, and third parts connecting each of the first parts GP1a and each of the second parts GP1b. A length of the first part GP1a of the first guard part GP1 in the first direction D1 may be greater than that of the stack structure STA in the first direction D1. A length of the second part GP1b of the first guard part GP1 in the second direction D2 may be greater than that of the stack structure STA in the second direction D2.

Each of the second guard part GP2 may include first parts GP2a (see FIG. 1D) extending in the first direction D1, second parts GP2b (see FIG. 1C) extending in the second direction D2, and third parts connecting each of the first parts GP2a and each of the second parts GP2b. A length of the first part GP2a of the second guard part GP2 in the first direction D1 may be greater than that of the stack structure STA in the first direction D1. A length of the second part GP2b of the second guard part GP2 in the second direction D2 may be greater than that of the stack structure STA in the second direction D2. The first parts GP2a of the second guard part GP2 may be spaced apart from each other in the second direction D2. The stack structure STA, the channel structure CS, the memory layer MR, and the source layer SA may be disposed between the first parts GP2a of the second guard part GP2. The second parts GP2b of the second guard part GP2 may be spaced apart from each other in the first direction D1. The stack structure STA, the channel structure CS, the memory layer MR, and the source layer SA may be disposed between the second parts GP2b of the second guard part GP2.

The first guard parts GP1 of each of the first to third chip guards CG1, CG2, and CG3 may be provided in the first insulating layer 110 of the first connection structure CNS1. The first guard parts GP1 of each of the first to third chip guards CG1, CG2, and CG3 may be stacked in the third direction D3. The first guard parts GP1 of each of the first to third chip guards CG1, CG2, and CG3 may overlap with each other. In an example, the first guard parts GP1 of each of the first to third chip guards CG1, CG2, and CG3 may vertically overlap with each other.

The second guard part GP2 of each of the first to third chip guards CG1, CG2, and CG3 may penetrate, in the third direction D3, the sixth insulating layer 160 of the source structure SOS, the fifth insulating layer 150, the fourth insulating layer 140 of the second connection structure CNS2, the third insulating layer 130 of the second bonding structure BDS2, and the second insulating layer 120 of the first bonding structure BDS1, and be in contact with a first guard part GP1 disposed at the highest level among the first guard parts GP1. The second guard part GP2 of each of the first to third chip guards CG1, CG2, and CG3 may be disposed on the first guard part GP1 disposed at the highest level among the first guard parts GP1.

The first guard parts GP1 of each of the first to third chip guards CG1, CG2, and CG3 may be disposed at the same level as the first connection conductors CB1 of the first connection structure CNS1. The first guard parts GP1 of each of the first to third chip guards CG1, CG2, and CG3 may surround the first connection conductors CB1 of the first connection structure CNS1.

The second guard part GP2 of each of the first to third chip guards CG1, CG2, and CG3 may surround the first and second bonding pads BP1 and BP2, the second connection conductors CB2, the word line contacts WCT, the third contacts CT3, the stack structure STA, the channel structures CS, the memory layers MR, and the source layer SA.

The first and second bonding pads BP1 and BP2, the second connection conductors CB2, the word line contacts WCT, the third contacts CT3, the stack structure STA, the channel structures CS, the memory layers MR, and the source layer SA may be disposed at the same level as the second guard part GP2. The first and second bonding pads BP1 and BP2, the second connection conductors CB2, the word line contacts WCT, the third contacts CT3, the stack structure STA, the channel structures CS, the memory layers MR, and the source layer SA may be disposed at a level higher than a bottom surface of the second guard part GP2, and be disposed at a level lower than that of a top surface of the second guard part GP2.

A seventh insulating layer 170 may be provided on the source structure SOS. The seventh insulating layer 170 may cover the third insulating layer 160. The seventh insulating layer 170 may include an insulating material. In an example, the seventh insulating layer 170 may include an oxide or nitride.

A third line ML3 may be provided in the seventh insulating layer 170. The third line ML3 may be connected to the source contacts SC. The third line ML3 may include a conductive material. A fourth line ML4 may be provided in the seventh insulating layer 170. The fourth line ML4 may be connected to the third contact CT3. The fourth line ML4 may include a conductive material.

Referring to FIG. 1E, the third contact CT3 may include a first barrier part BO1 and a first conductive part CO1. The first conductive part CO1 may extend in the third direction D3. The first conductive part CO1 may extend from the sixth insulating layer 160 of the source structure SOS to the first insulating layer 110 of the first connection structure CNS1. The first conductive part CO1 may penetrate the sixth insulating layer 160 of the source structure SOS, the fifth insulating layer 150, the fourth insulating layer 140 of the second connection structure CNS2, the third insulating layer 130 of the second bonding structure BDS2, and the second insulating layer 120 of the first bonding structure BDS1.

An outer wall CO1_S of the first conductive part CO1 may extend from the sixth insulating layer 160 of the source structure SOS to the first insulating layer 110 of the first connection structure CNS1. The outer wall CO1_S of the first conductive part CO1 may penetrate the sixth insulating layer 160 of the source structure SOS, the fifth insulating layer 150, the fourth insulating layer 140 of the second connection structure CNS2, the third insulating layer 130 of the second bonding structure BDS2, and the second insulating layer 120 of the first bonding structure BDS1.

A bottom surface CO1_B of the first conductive part CO1 may be provided in the first insulating layer 110 of the first connection structure CNS1. The first conductive part CO1 may include a conductive material. In an example, the first conductive part CO1 may include tungsten or aluminum.

The first barrier part 601 may extend in the third direction D3. The first barrier part 601 may extend from the sixth insulating layer 160 of the source structure SOS to the first insulating layer 110 of the first connection structure CNS1. The first barrier part 1301 may penetrate the sixth insulating layer 160 of the source structure SOS, the fifth insulating layer 150, the fourth insulating layer 140 of the second connection structure CNS2, the third insulating layer 130 of the second bonding structure BDS2, and the second insulating layer 120 of the first bonding structure BDS1.

An outer wall BO1_S of the first barrier part 601 may extend from the sixth insulating layer 160 of the source structure SOS to the first insulating layer 110 of the first connection structure CNS1. The outer wall BO1_5 of the first barrier part 601 may penetrate the sixth insulating layer 160 of the source structure SOS, the fifth insulating layer 150, the fourth insulating layer 140 of the second connection structure CNS2, the third insulating layer 130 of the second bonding structure BDS2, and the second insulating layer 120 of the first bonding structure BDS1.

The first barrier part BO1 may surround the first conductive part CO1. The first barrier part BO1 may cover the outer wall CO1_S and the bottom surface CO1_B of the first conductive part CO1. The first conductive part CO1 may be provided in the first barrier part BO1. A bottom surface BO1_3 of the first barrier part BO1 may be provided in the first insulating layer 110 of the first connection structure CNS1. The bottom surface BO1_B of the first barrier part 301 may be in contact with the first connection conductor CB1 in the first connection structure CNS1. The first barrier part 301 may include a conductive material different from that of the first conductive part CO1. In an example, the first barrier part 301 may include titanium, titanium nitride, tantalum or tantalum nitride.

The bottom surface CO1_B of the first conductive part CO1 may be spaced apart from the first connection conductor CB1 by the first barrier part BO1. Similarly to the third contact CT3, the first connection conductor CB1 may include a second barrier part BO2 and a second conductive part CO2.

Referring to FIG. 1F, the second guard part GP2 of each of the first to third chip guards CG1, CG2, and CG3 may include a third barrier part BO3 and a third conductive part CO3. The third conductive part CO3 may extend in the third direction D3. The third conductive part CO3 may extend from the sixth insulating layer 160 of the source structure SOS to the first insulating layer 110 of the first connection structure CNS1. The third conductive part CO3 may penetrate the sixth insulating layer 160 of the source structure SOS, the fifth insulating layer 150, the fourth insulating layer 140 of the second connection structure CNS2, the third insulating layer 130 of the second bonding structure BDS2, and the second insulating layer 120 of the first bonding structure BDS1.

An outer wall CO3_S of the third conductive part CO3 may extend from the sixth insulating layer 160 of the source structure SOS to the first insulating layer 110 of the first connection structure CNS1. The outer wall CO3_S of the third conductive part CO3 may penetrate the sixth insulating layer 160 of the source structure SOS, the fifth insulating layer 150, the fourth insulating layer 140 of the second connection structure CNS2, the third insulating layer 130 of the second bonding structure BDS2, and the second insulating layer 120 of the first bonding structure BDS1.

A bottom surface CO3_B may be provided in the first insulating layer 110 of the first connection structure CNS1. The third conductive part CO3 may include a conductive material. In an example, the third conductive part CO3 may include tungsten or aluminum.

The third barrier part BO3 may extend in the third direction D3. The third barrier part 803 may extend from the sixth insulating layer 160 of the source structure SOS to the first insulating layer 110 of the first connection structure CNS1. The third barrier part BO3 may penetrate the sixth insulating layer 160 of the source structure SOS, the fifth insulating layer 150, the fourth insulating layer 140 of the second connection structure CNS2, the third insulating layer 130 of the second bonding structure BDS2, and the second insulating layer 120 of the first bonding structure BDS1.

An outer wall BO3_S of the third barrier part 303 may extend from the sixth insulating layer 160 of the source structure SOS to the first insulating layer 110 of the first connection structure CNS1. The outer wall BO3_S of the third barrier part 303 may penetrate the sixth insulating layer 160 of the source structure SOS, the fifth insulating layer 150, the fourth insulating layer 140 of the second connection structure CNS2, the third insulating layer 130 of the second bonding structure BDS2, and the second insulating layer 120 of the first bonding structure BDS1.

The third barrier part BO3 may surround the third conductive part CO3. The third barrier part BO3 may covert the outer wall CO3_S and the bottom surface CO3_B of the third conductive part CO3. The third conductive part CO3 may be provided in the third barrier part BO3. A bottom surface BO3_B of the third barrier part 303 may be provided in the first insulating layer 110 of the first connection structure CNS1. The bottom surface BO3_B of the third barrier part 303 may be in contact with the first guard part GP1 in the first connection structure CNS1. The third barrier part 303 may include a conductive material different from that of the third conductive part CO3. In an example, the third barrier part CO3 may include titanium, titanium nitride, tantalum, or tantalum nitride.

The bottom surface CO3_B of the third conductive part CO3 may be spaced apart from the first guard part GP1 by the third barrier part BO3. Similarly to the second guard part GP2, the first guard part GP1 may include a fourth barrier part BO4 and a fourth conductive part CO4.

The second guard part GP2 may be provided in a first through slit SL1. The first through slit SL1 may extend from the sixth insulating layer 160 of the source structure SOS to the first insulating layer 110 of the first connection structure CNS1. The first through slit SL1 may penetrate the sixth insulating layer 160 of the source structure SOS, the fifth insulating layer 150, the fourth insulating layer 140 of the second connection structure CNS2, the third insulating layer 130 of the second bonding structure BDS2, and the second insulating layer 120 of the first bonding structure BDS1. The second guard part GP2 may cover a sidewall SL1_S and a bottom surface SL1_B of the first through slit SL1. The third barrier part BO3 of the second guard part GP2 may cover the sidewall SL1_S and the bottom surface SL1_B of the first through slit SL1.

The semiconductor device in accordance with the embodiment of the present disclosure includes the third contacts CT3 and the first to third chip guards CG1, CG2, and CG3, which extend from the source structure SOS to the first connection structure CNS1. Accordingly, the degree of line freedom of the semiconductor device can be ensured, and the size of the semiconductor device can be reduced or minimized.

The semiconductor device in accordance with the embodiment of the present disclosure includes first to third chip guards CG1, CG2, and CG3, which extend from the source structure SOS to the first connection structure CNS1, so that the first to third chip guards CG1, CG2, and CG3 can seal other components even at a portion adjacent to a bonding interface. Thus, chip cracks can be reduced or prevented, and moisture absorption can be mitigated or blocked.

FIGS. 2, 3A, 3B, 4A, 4B, 5, 6, 7A, and 7B are views illustrating a manufacturing method of the semiconductor device shown in FIGS. 1A to 1F.

For convenience of description, components identical to those described with reference to FIGS. 1A to 1F are designated by like reference numerals, and repeated descriptions will be omitted.

The manufacturing method described below is merely one embodiment of a manufacturing method of the semiconductor device shown in FIGS. 1A to 1F. Manufacturing methods of the semiconductor device shown in FIGS. 1A to 1F are not limited to the one described below.

Referring to FIG. 2, a second semiconductor structure SEM2 may be formed, which includes a second substrate 200, a source structure SOS, a stack structure STA, and a fifth insulating layer 150.

The second substrate 200 may be formed. The second substrate 200 may have the shape of a plate extending along a plane defined by the first direction D1 and the second direction D2. The second substrate 200 may be a semiconductor substrate. In an example, the second substrate 200 may be a silicon substrate.

The source structure SOS may be formed on the second substrate 200. Forming the source structure SOS may include forming a sixth insulating layer 160 on the second substrate 200, and forming a source layer SA in the sixth insulating layer SA.

The stack structure STA and the fifth insulating layer 150 may be formed on the source structure SOS. Forming the stack structure STA and the fifth insulating layer 150 may include alternately forming insulating layers IP and stack sacrificial layers FL on the source structure SOS, forming a stepped structure by etching the insulating layers IP and the stack sacrificial layers FL, and forming the fifth insulating layer 150. The stack sacrificial layers FL may include a material different from that of the insulating layers IP. In an example, the stack sacrificial layers FL may include a nitride.

Channel structures CS and memory layers MR may be formed, which penetrate the stack structure STA.

Figure 3B:
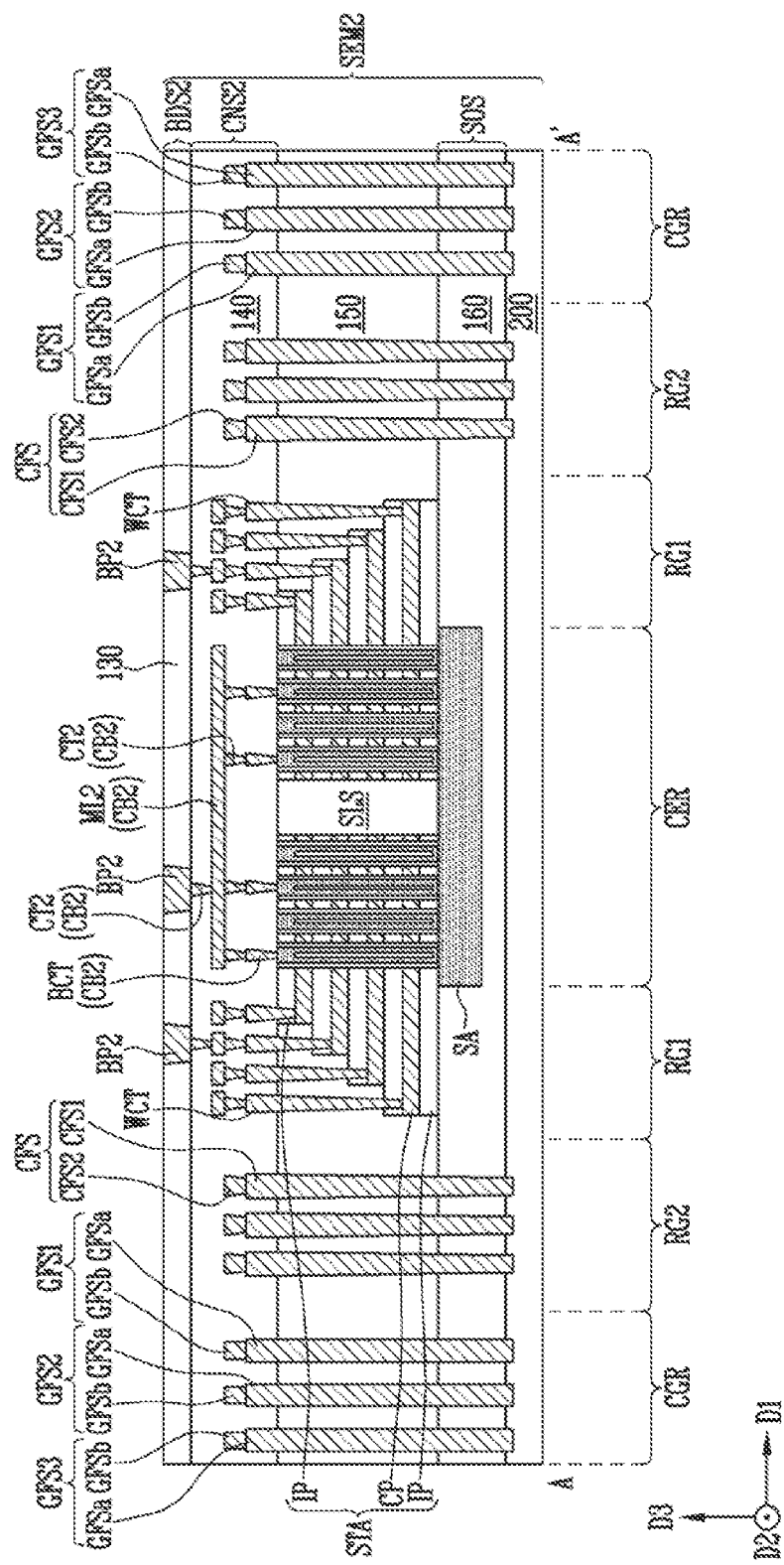

Referring to FIGS. 3A and 3B, conductive patterns CP and a slit structure SLS may be formed. Forming the conductive patterns CP and the slit structure SLS may include forming a slit penetrating the stack structure STA, removing the stack sacrificial layers FL through the slit, forming the conductive patterns CP in empty spaces in which the stack sacrificial layers FL are removed, and forming the slit structure SLS in the slit.

A second connection structure CNS2 may be formed on the stack structure STA and the fifth insulating layer 150. A fourth insulating layer 140, bit line contacts BCT in the fourth insulating layer 140, second contacts CT2, and second lines ML2 may be formed.

Word line contacts WCT connected to the conductive patterns CP may be formed. The word line contacts WCT may be formed earner than the second contacts CT2. A portion of the fourth insulating layer 140 may be formed, the word line contact WCT penetrating the portion of the fourth insulating layer 140 may be formed, and another portion of the fourth insulating layer 140, which covers the word line contacts WCT, may be formed.

Contact sacrificial structures CFS may be formed in a second region RG2. A portion of the fourth insulating layer 140 may be formed, the contact sacrificial structures CFS penetrating the portion of the fourth insulating layer 140 may be formed, and then another portion of the fourth insulating layer 140, which covers the contact sacrificial structures CFS, may be formed.

The contact sacrificial structures CFS may extend in the third direction D3. The contact sacrificial structures CFS may extend from the fourth insulating layer 140 to the second substrate 200. The contact sacrificial structures CFS may penetrate the fifth insulating layer 150 and the sixth insulating layer 160 of the source structure SOS. Lowermost portions of the contact sacrificial structures CFS may be provided in the second substrate 200.

Each of the contact sacrificial structures CFS may include a first part CFS1 and a second part CFS2. The second part CFS2 of the contact sacrificial structure CFS may be disposed on the first part CFS1 of the contact sacrificial structure CFS. The second part CFS2 of the contact sacrificial structure CFS may be disposed in the fourth insulating layer 140 of the second connection structure CNS2. The first part CFS1 of the contact sacrificial structure CFS may extend from the fourth insulating layer 140 to the second substrate 200, and penetrate the fifth insulating layer 150 and the sixth insulating layer 160 of the source structure SOS. The contact sacrificial structures CFS may include a conductive material.

The first part CFS1 of the contact sacrificial structure CFS may be simultaneously formed with the word line contact WCT. The second part CFS2 of the contact sacrificial structure CFS nay be simultaneously formed with the second contact CT2 connected to the word line contact WCT.

A first guard sacrificial structure GFS1, a second guard sacrificial structure GFS2, and a third guard sacrificial structure GFS3 may be formed in a chip guard region CGR. A portion of the fourth insulating layer 140 may be formed, the first to third guard sacrificial structures GFS1, GFS2, and GFS3 penetrating the portion of the fourth insulating layer 140 are formed, and another portion of the fourth insulating layer 140, which covers the first to third guard sacrificial structures GFS1, GFS2, and GFS3, may be formed.

The first to third guard sacrificial structures GFS1, GFS2, and GFS3 may extend in the third direction D3. The first to third guard sacrificial structures GFS1, GFS2, and GFS3 may extend from the fourth insulating layer 140 to the second substrate 200. The first to third guard sacrificial structures GFS1, GFS2, and GFS3 may penetrate the fifth insulating layer 150 and the sixth insulating layer 160 of the source structure SOS. Lowermost portions of the first to third guard sacrificial structures GFS1, GFS2, and GFS3 may be provided in the second substrate 200.

Each of the first to third guard sacrificial structures GFS1, GFS2, and GFS3 may include a first part GFSa and a second part GFSb. The second part GFSb of each the first to third guard sacrificial structures GFS1, GFS2, and GFS3 may be disposed on the first part GFSa of each the first to third guard sacrificial structures GFS1, GFS2, and GFS3. The second part GFSb of each the first to third guard sacrificial structures GFS1, GFS2, and GFS3 may be disposed in the fourth insulating layer 140 of the second connection structure CNS2. The first part GFSa of each the first to third guard sacrificial structures GFS1, GFS2, and GFS3 may extend from the fourth insulating layer 140 to the second substrate 200, and penetrate the fifth insulating layer 150 and the sixth insulating layer 160 of the source structure SOS. The first to third guard sacrificial structures GFS1, GFS2, and GFS3 may include a conductive material.

The first part GFSa of each the first to third guard sacrificial structures GFS1, GFS2, and GFS3 may be simultaneously formed with the word line contact WCT and the first part CFS1 of the contact sacrificial structure CFS. The second part GFSb of each the first to third guard sacrificial structures GFS1, GFS2, and GFS3 may be simultaneously formed with the second contact CT2 connected to the word line contact WCT and the second part CFS2 of the contact sacrificial structure CFS.

Each of first to third guard sacrificial structures GFS1, GFS2, and GFS3 may surround a cell region CER. Each of first to third guard sacrificial structures GFS1, GFS2, and GFS3 may surround the stack structure STA, the channel structures CS, the memory layers MR, and the source layer SA. The second guard sacrificial structure GFS2 may surround the first guard sacrificial structure GFS1. The third guard sacrificial structure GFS3 may surround the first and second guard sacrificial structures GFS1 and GFS2.

A second bonding structure BDS2 may be formed on the second connection structure CNS2. A third insulating layer 130 and second bonding pads BP2 in the third insulating layer 130 may be formed.

Figure 4B:
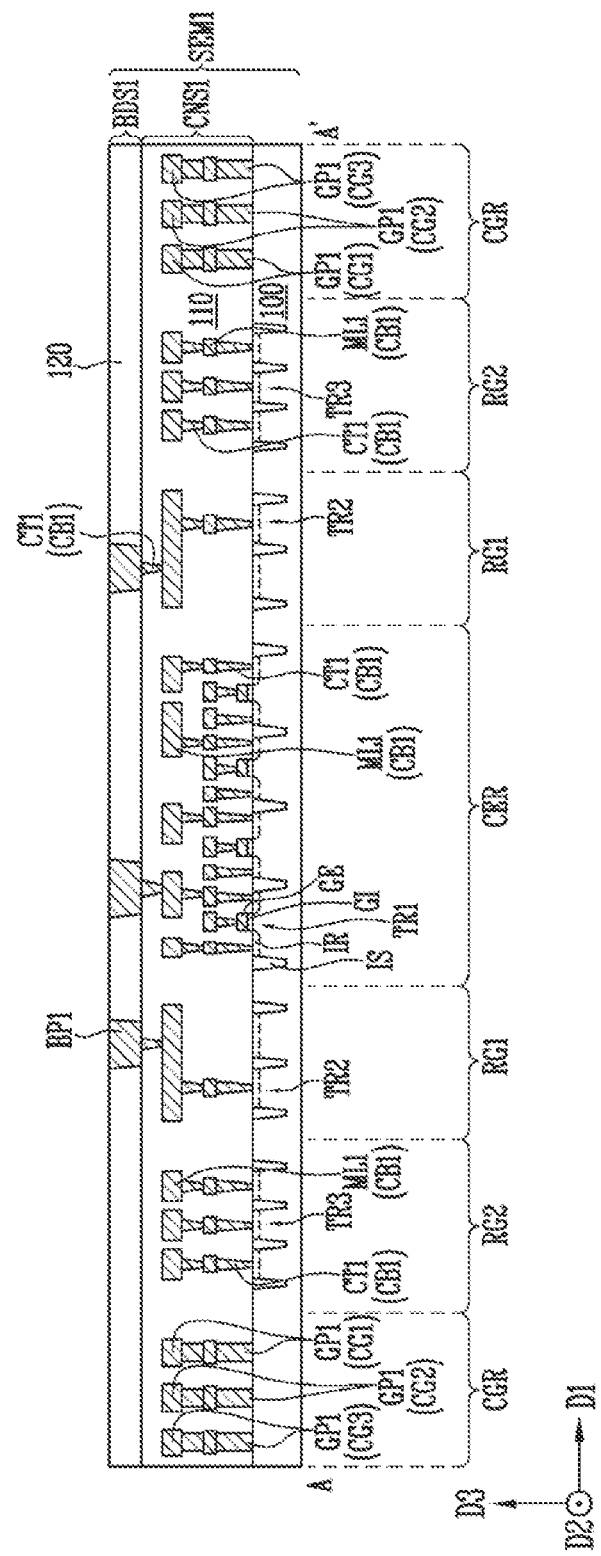

Referring to FIGS. 4A and 4B, a first semiconductor structure SEM1 may be formed, which includes a first substrate 100, first to third transistors TR1, TR2, and TR3, a first connection structure CNS1, and a first bonding structure BDS1.

The first substrate 100 may be formed. The first transistors TR1 may be formed on a cell region CER of the first substrate 100, the second transistors TR2 may be formed on a first region RG1 of the first substrate 100, and the third transistors TR3 may be formed on a third region RG3 of the first substrate 100.

The first connection structure CNS1 may be formed on the first substrate 100 and the first to third transistors TR1, TR2, and TR3. A first insulating layer 110 covering the first substrate 100 and the first to third transistors TR1, TR2, and TR3, and first contacts CT1 and first lines ML1 in the first insulating layer 110 may be formed.

First guard parts GP1 of each of first to third chip guards CG1, CG2, and CG3 may be formed in the first insulating layer 110. A portion of the first insulating layer 110 may be formed, the first guard parts GP1 penetrating the portion of the first insulating layer 110 may be formed, and another portion of the first insulating layer 110, which covers the first guard parts GP1, may be formed.

The first guard parts GP1 of the first chip guard CG1 may surround the cell region CER. The first guard parts GP1 of the first chip guard CG1 may surround the first contacts CT1 and the first lines ML1 of the first connection conductor CB1. The first guard parts GP1 of the second chip guard CG2 may surround the first guard parts GP1 of the first chip guard CG1. The first guard parts GP1 of the third chip guard CG3 may surround the first guard parts GP1 of the second chip guard CG2.

The first bonding structure BDS1 may be formed on the first connection structure CNS1. A second insulating layer 120 and first bonding pads BP1 in the second insulating layer 120 may be formed.

Figure 5:
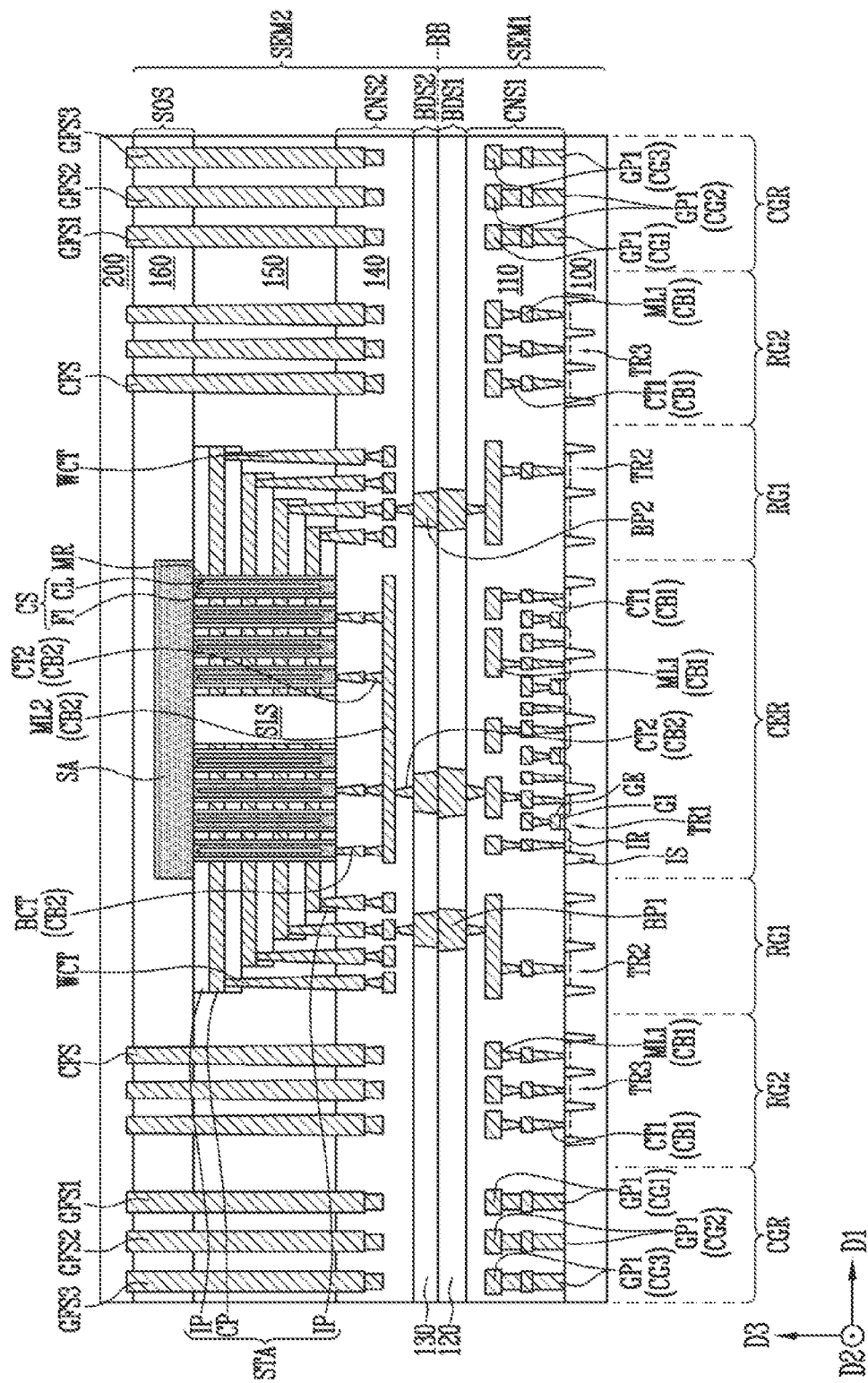

Referring to FIG. 5, the first semiconductor structure SEM1 and the second semiconductor structure SEM2 may be bonded to each other through a wafer bonding process. The first bonding structure BDS1 and the second bonding structure BDS2 may be bonded to each other through the wafer bonding process. The first bonding pad BP1 of the first bonding structure BDS1 and the second bonding pad BP2 of the second bonding structure BDS2 may be boded to each other. The second insulating layer 120 of the first bonding structure BDS1 and the third insulating layer 130 of the second bonding structure BDS2 may be bonded to each other.

After the second semiconductor structure SEM2 is reversed, the first semiconductor structure SEM1 and the second semiconductor structure SEM2 may be bonded to each other. Accordingly, the second substrate 200 may be exposed. A bonding interface BB between the first bonding structure BDS1 and the second bonding structure BDS2 may be defined. The bonding interface BB may be defined between the first bonding pad BP1 and the second bonding pad BP2.

Figure 6:
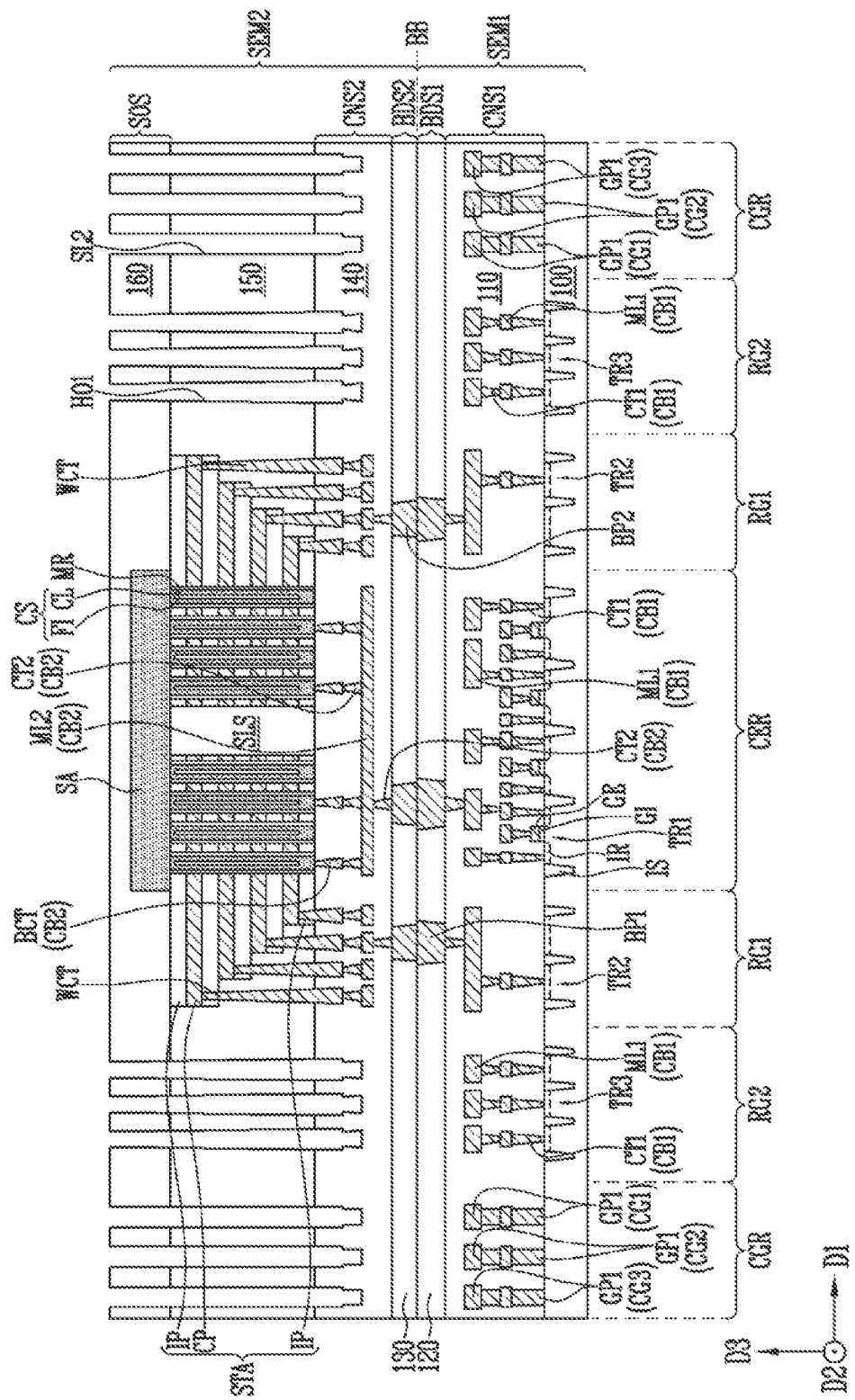

Referring to FIG. 6, the exposed second substrate 200 may be removed. When the second substrate 200 is removed, the contact sacrificial structures CFS and the first to third guard sacrificial structures GFS1, GFS2, and GFS3 may be exposed.

The exposed contact sacrificial structures CFS and the exposed first to third guard sacrificial structures GFS1, GFS2, and GFS3 may be removed. When the contact sacrificial structures CFS are removed, first holes HO1 may be formed. Empty spaces formed when the contact sacrificial structures CFS are removed may be defined as the first holes HO1. The first holes HO1 may extend in the third direction D3 from the sixth insulating layer 160 to the fourth insulating layer 140 of the second connection structure CNS2, and penetrate the sixth insulating layer 160 and the fifth insulating layer 150. Bottom surfaces of the first holes HO1 may be located at a level higher than that of the bonding interface BB.

When the exposed first to third guard sacrificial structures GFS1, GFS2, and GFS3 are removed, second through slits SL2 may be formed. Empty spaces formed when the first to third guard sacrificial structures GFS1, GFS2, and GFS3 are removed may be defined as the second through slits SL2. The second through slits SL2 may extend in the third direction D3 from the sixth insulating layer 160 of the source structure SOS to the fourth insulating layer 140 of the second connection structure CNS2, and penetrate the sixth insulating layer 160 and the fifth insulating layer 150. Bottom surfaces of the second through slits SL2 may be disposed in the fourth insulating layer 140 of the second connection structure CNS2. The bottom surfaces of the second through slits SL2 may be located at a level higher than the bonding interface BB. The second through slits SL2 may surround the cell region CER. The second through slits SL2 may surround the stack structure STA, the channel structures CS, the memory layers MR, and the source layer SA.

Figure 7A:
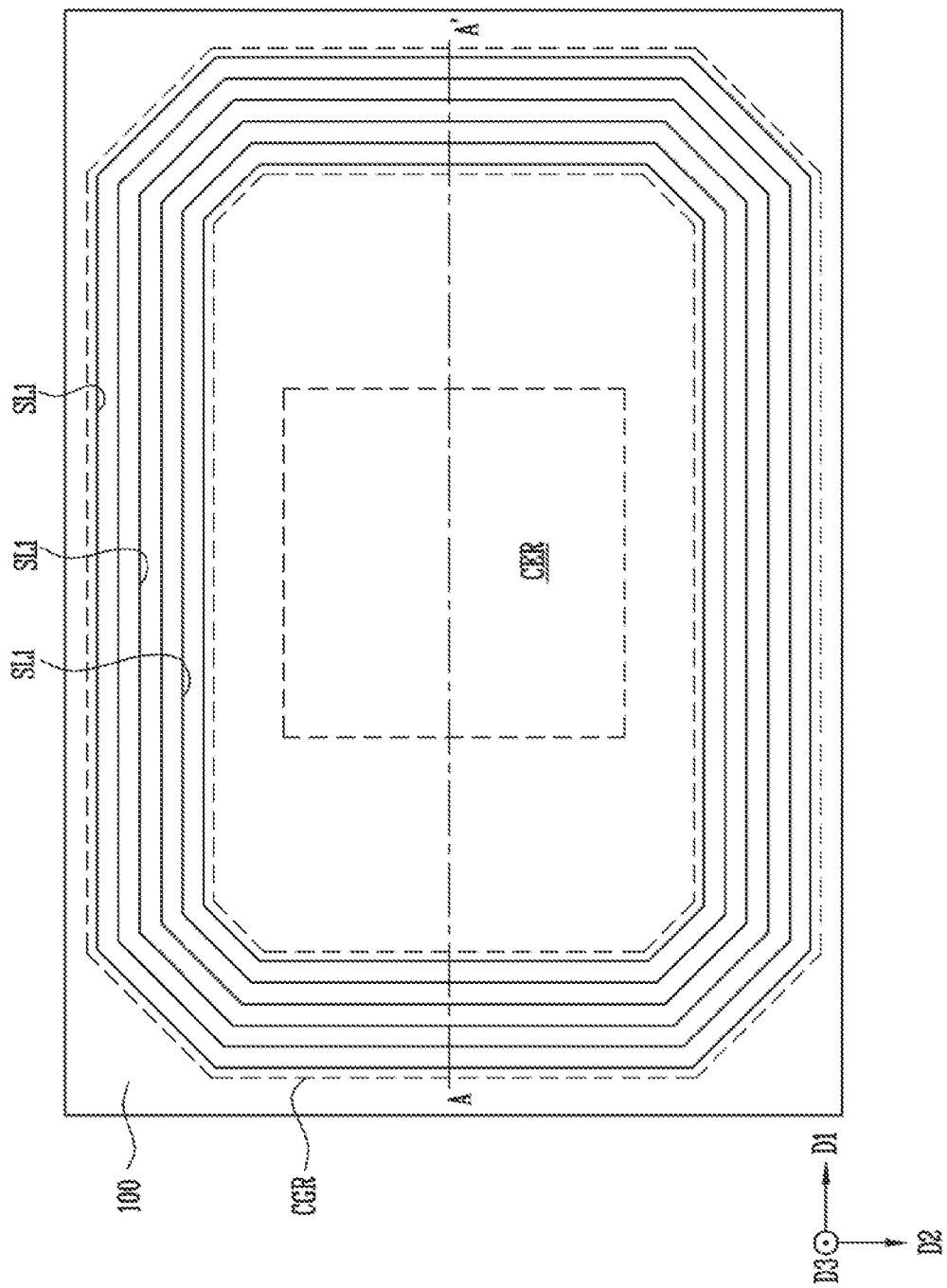
Figure 7B:
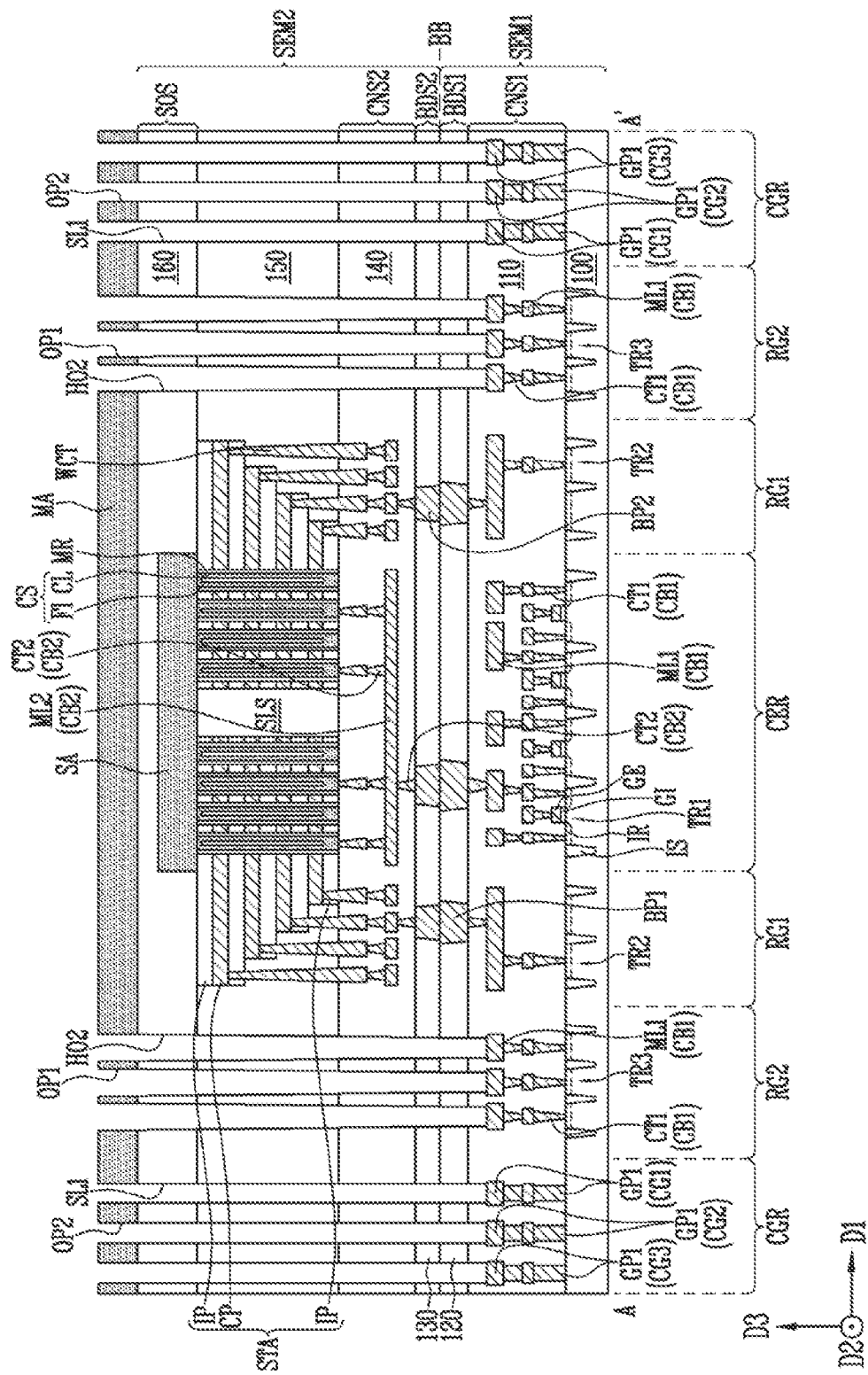

Referring to FIGS. 7A and 7B, a mask layer MA may be formed on the source structure SOS. The mask layer MA may include first openings OP1 and second openings OP2. Forming the mask layer MA may include forming a photoresist layer on the source structure SOS, and forming the first openings OP1 and the second openings OP2 by patterning the photoresist layer.

The first openings OP1 of the mask layer MA may respectively overlap with the first holes HO1. The second openings OP2 of the mask layer MA may respectively overlap with the second through slits SL2.

An etching process may be performed by using the mask layer MA as an etch barrier. According to the etching process, the fourth insulating layer 140 of the second connection structure CNS2, the third insulating layer 130 of the second bonding structure BDS2, the second insulating layer 120 of the first bonding structure BDS1, and the first insulating layer 110 of the first connection structure CNS1 may be etched. According to the etching process, the first holes HO1 and the second through slits SL2 may be expanded.

The expanded first holes HO1 may be defined as second holes HO2. The second holes HO2 may penetrate the fourth insulating layer 140 of the second connection structure CNS2, the third insulating layer 130 of the second bonding structure BDS2, the bonding interface BB, and the second insulating layer 120 of the first bonding structure BDS1, and extend down to the first insulating layer 110 of the first connection structure CNS1. The first lines ML1 of the first connection conductors CB1 in the second region RG2 may be exposed by the second holes HO.

The expanded second through slits SL2 may be defined as first through slits SL1. The first through slits SL1 may penetrate the fourth insulating layer 140 of the second connection structure CNS2, the third insulating layer 130 of the second bonding structure BDS2, the bonding interface BB, and the second insulating layer 120 of the first bonding structure BDS1, and extend down to the first insulating layer 110 of the first connection structure CNS1. The first guard parts GP1 in the chip guard region CGR may be exposed by the first through slits SL1.

After the second holes HO2 and the first through slits SL1 are formed, the remaining mask layer MA may be removed. Subsequently, third contact CT3 (see FIG. 1B) may be formed in the second holes HO2, and second guard parts GP2 (see FIG. 1B) may be formed in the first through slits SL1. Subsequently, a source contact SC (see FIG. 1B) connected to the source layer SA may be formed.

A seventh insulating layer 170 (see FIG. 1B) may be formed which covers the source contact SC, the third contact CT3, and the second guard parts GP2. Third lines ML3 and fourth lines ML4 may be formed in the seventh insulating layer 170.

In the manufacturing method of the semiconductor device in accordance with this embodiment, the contact sacrificial structure CFS and the guard sacrificial structure GFS1, GFS2, and GFS3 are simultaneously formed, the wafer bonding process is performed, and then the third contacts CT3 and the second guard parts GP2 are formed by removing the contact sacrificial structure CFS and the guard sacrificial structure GFS1, GFS2, and GFS3. Accordingly, the process of forming the third contacts CT3 and the second guard parts GP2 can be simplified.

Figure 8:
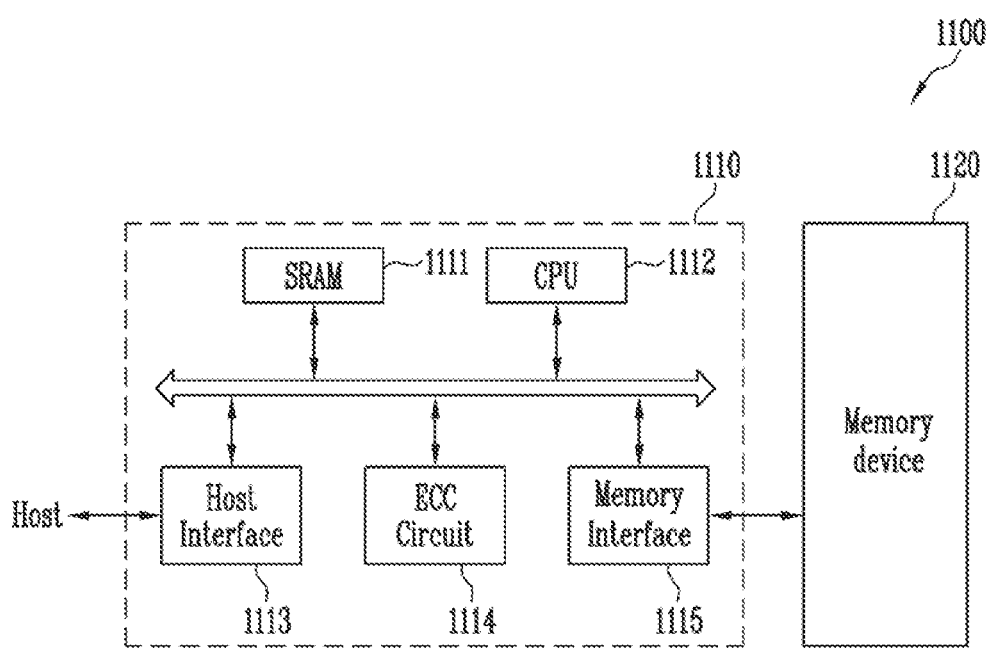
FIG. 8 is a block diagram illustrating a configuration of a memory system in accordance with an embodiment of the present disclosure.

FIG. 8 is a block diagram illustrating a configuration of a memory system 1100 in accordance with an embodiment of the present disclosure.

Referring to FIG. 8, the memory system 1100 includes a memory device 1120 and a memory controller 1110.

The memory device 1120 may include the semiconductor device described above. The memory device 1120 may be a mufti-chip package configured with a plurality of flash memory chips.

The memory controller 1110 is configured to control the memory device 1120, and may include Static Random Access Memory (SRAM) 1111, a Central Processing Unit (CPU) 1112, a host interface 1113, an Error Correction Code (ECC) circuit 1114, and a memory interface 1115. The SRAM 1111 is used as operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicate with the outside (e.g., the host) through one of various interface protocols, such as a Universal Serial Bus (USB) protocol, a Mufti-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (DATA) protocol, a Small Computer System Interface (SCSI) protocol, an Enhanced Small Disk Interface (ESDI) protocol, and an Integrated Drive Electronics (IDE) protocol.

Figure 9:
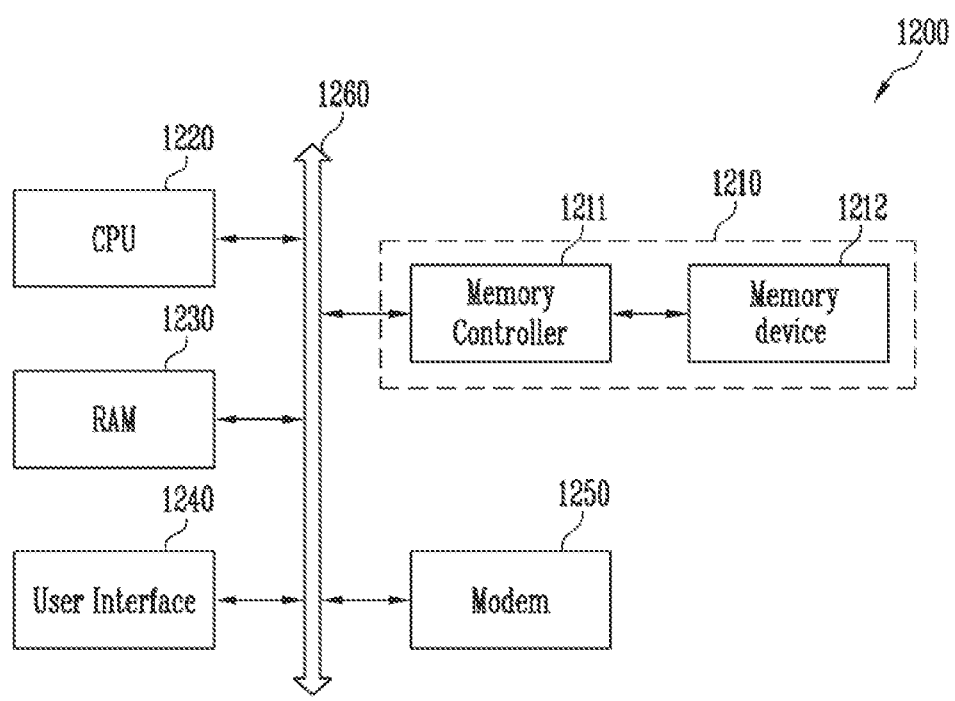
FIG. 9 is a block diagram illustrating a configuration of a computing system in accordance with an embodiment of the present disclosure.

FIG. 9 is a block diagram illustrating a configuration of a computing system 1200 in accordance with an embodiment of the present disclosure.

Referring to FIG. 9, the computing system 1200 may include a CPU 1220, random access memory (RAM) 1230, a user interface 1240, a modem 1250, and a memory system 1210, which are electrically connected to a system bus 1260, When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211, which are similar to those described with reference to FIG. 8.

In accordance with the present disclosure, a semiconductor device includes a contact and a chip guard, which penetrate a bonding interface between semiconductor structures. Accordingly, the degree of arrangement freedom of the semiconductor device can be ensured, and the size of the semiconductor device can be reduced or minimized.

Embodiments of the present disclosure have been described in the drawings and specification. Although specific terminologies are used here, they are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A semiconductor device comprising:
   a substrate;
   a first connection structure disposed on the substrate, the first connection structure including a first connection conductor;
   a transistor disposed between the substrate and the first connection structure, the transistor being connected to the first connection conductor;
   a first bonding structure including a first bonding pad connected to the first connection conductor, the first bonding structure being disposed on the first connection structure;
   a second bonding structure including a second bonding pad connected to the first bonding pad, the second bonding structure being disposed on the first bonding structure;
   a second connection structure including a second connection conductor connected to the second bonding pad, the second connection structure being disposed on the second bonding structure;
   a stack structure disposed on the second connection structure, the stack structure including alternately stacked insulating layers and conductive patterns;
   a channel structure penetrating the stack structure, the channel structure being connected to the second connection conductor; and
   a chip guard extending in a vertical direction in the second connection structure, the second bonding structure, the first bonding structure, and the first connection structure, physically and electrically spaced apart from the first bonding pad and the second bonding pad, and surrounding the stack structure and the channel structure, wherein the chip guard comprises a single continuous piece extending vertically through the second connection structure, the second bonding structure, the first bonding structure, and extending into the first connection structure, wherein the single continuous piece is planar and continuous in the vertical direction without a protrusion extending outward from the planar surface of the single continuous piece, and wherein the chip guard comprises multiple separate pieces within the first connection structure.

2. The semiconductor device of claim 1, wherein the first bonding pad and the second bonding pad include copper.

3. The semiconductor device of claim 1, wherein the chip guard includes:
first guard parts in the first connection structure; and
a second guard part penetrating the second connection structure, the second bonding structure, and the first bonding structure.

4. The semiconductor device of claim 3, wherein the first guard parts overlap with each other.

5. The semiconductor device of claim 3, wherein the second guard part includes:
a conductive part penetrating the second connection structure, the second bonding structure, and the first bonding structure; and
a barrier part surrounding the conductive part.

6. The semiconductor device of claim 5, wherein the conductive part and the barrier part include different materials.

7. The semiconductor device of claim 6, wherein the barrier part includes titanium or tantalum.

8. The semiconductor device of claim 5, wherein the barrier part covers a sidewall and a bottom surface of the conductive part.

9. The semiconductor device of claim 1, further comprising a source structure including a source layer connected to the channel structure, the source structure being disposed on the stack structure.

10. The semiconductor device of claim 9, wherein the chip guard penetrates the source structure.

11. The semiconductor device of claim 3, wherein the second guard part fills a through slit penetrating the second connection structure, the second bonding structure and the first bonding structure.

12. The semiconductor device of claim 11, wherein the second guard part includes:
a barrier part covering a sidewall and a bottom surface of the through slit; and
a conductive part in the barrier part.

13. The semiconductor device of claim 12, wherein a sidewall of the barrier part extends from the second connection structure to the first connection structure.

14. A semiconductor device comprising:
a transistor;
a first connection structure including a first connection conductor, the first connection conductor being connected to the transistor;
a first bonding structure including a first bonding pad, the first bonding pad being connected to the first connection conductor;
a second bonding structure including a second bonding pad, the second bonding pad being connected to the first bonding pad;
a second connection structure including a second connection conductor, the second connection conductor being connected to the second bonding pad;
a channel structure connected to the second connection conductor; and
a chip guard including a first guard part and a second guard part on the first guard part,
wherein the second guard part surrounds the first bonding pad, the second bonding pad, the second connection conductor, and the channel structure, and
wherein the second guard part extends vertically in the second connection structure, the second bonding structure, and the first bonding structure, and is physically and electrically spaced apart from the first bonding pad and the second bonding pad, wherein the second guard part comprises a single continuous piece extending vertically through the second connection structure, the second bonding structure, and the first bonding structure, and extending into the first connection structure, wherein the single continuous piece is planar and continuous in the vertical direction without a protrusion extending outward from the planar surface of the single continuous piece, and wherein the first guard part comprises multiple separate pieces within the first connection structure.

15. The semiconductor device of claim 14, wherein the second guard part penetrates a bonding interface between the first bonding pad and the second bonding pad.

16. The semiconductor device of claim 14, wherein the second guard part includes:
a conductive part; and
a barrier part covering a sidewall and a bottom surface of the conductive part.

17. The semiconductor device of claim 16, wherein the conductive part and the barrier part penetrate a bonding interface between the first bonding pad and the second bonding pad.

18. The semiconductor device of claim 16, wherein:
the conductive part is spaced apart from the first guard part; and
the barrier part is in contact with the first guard part.

19. A semiconductor device comprising:
a transistor;
a first connection structure including a first connection conductor, the first connection conductor being connected to the transistor;
a first bonding structure including a first bonding pad, the first bonding pad being connected to the first connection conductor;
a second bonding structure including a second bonding pad, the second bonding pad being connected to the first bonding pad;
a second connection structure including a second connection conductor, the second connection conductor being connected to the second bonding pad;
a channel structure connected to the second connection conductor;
a stack structure surrounding the channel structure; and
a chip guard surrounding the first connection conductor, the first bonding pad, the second bonding pad, the second connection conductor, the channel structure, and the stack structure,
wherein the chip guard includes a first guard part and a second guard part on the first guard part,
wherein the first bonding pad, the second bonding pad, the second connection conductor, the channel structure, and the stack structure are disposed at a level higher than a level of a bottom surface of the second guard part and lower than a level of a top surface of the second guard part, and wherein the second guard part extends vertically in the second connection structure, the second bonding structure, and the first bonding structure, and is physically and electrically spaced apart from the first bonding pad and the second bonding pad, wherein the second guard part comprises a single continuous piece extending vertically through the second connection structure, the second bonding structure, and the first bonding structure, and extending into the first connection structure, wherein the single continuous piece is planar and continuous in the vertical direction without a protrusion extending outward from the planar surface of the single continuous piece, and wherein the first guard part comprises multiple separate pieces within the first connection structure.

20. The semiconductor device of claim 19, wherein the second guard part includes first parts extending in a first direction, the first parts being spaced apart from each other in a second direction intersecting the first direction,
wherein the stack structure is disposed between the first parts, and
wherein a length of each of the first parts in the first direction is greater than a length of the stack structure in the first direction.

\* \* \* \* \*